US 8,300,490 B2

(12) United States Patent
Moriwaki

(10) Patent No.: US 8,300,490 B2
(45) Date of Patent: Oct. 30, 2012

(54) SEMICONDUCTOR MEMORY AND SYSTEM

(75) Inventor: Shinichi Moriwaki, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 355 days.

(21) Appl. No.: 12/776,744

(22) Filed: May 10, 2010

(65) Prior Publication Data
US 2010/0290295 A1 Nov. 18, 2010

(30) Foreign Application Priority Data
May 12, 2009 (JP) ................................. 2009-115452

(51) Int. Cl.
*G11C 8/00* (2006.01)
(52) U.S. Cl. .............. 365/230.03; 365/189.06; 365/198; 365/203; 365/205; 365/233.1
(58) Field of Classification Search ............. 365/189.06, 365/198, 203, 205, 210.1, 230.03, 233.1
See application file for complete search history.

(56) References Cited

U.S. PATENT DOCUMENTS

| | | | | |
|---|---|---|---|---|
| 5,901,092 A | * | 5/1999 | Tran | 365/195 |
| 6,834,328 B2 | * | 12/2004 | Dwarkadas et al. | 711/128 |
| 7,791,976 B2 | * | 9/2010 | Rao et al. | 365/227 |
| 2003/0067799 A1 | | 4/2003 | DeMaris et al. | |
| 2005/0207239 A1 | | 9/2005 | Kodama | |
| 2008/0204073 A1 | * | 8/2008 | Singh et al. | 326/38 |

FOREIGN PATENT DOCUMENTS

| | | |
|---|---|---|
| JP | 63-044400 A | 2/1988 |
| JP | 2005-506645 A | 3/2005 |
| JP | 2005-267744 A | 9/2005 |

* cited by examiner

*Primary Examiner* — Hoai V Ho
(74) *Attorney, Agent, or Firm* — Arent Fox LLP

(57) ABSTRACT

A semiconductor memory includes a word line coupled to memory cells that transmits a word line signal; at least one word repeater circuit that includes a first load circuit disposed on the word line; a first dummy word line disposed along the word line that transmits a first dummy word line signal; at least one dummy repeater circuit that includes a second load circuit disposed on the first dummy word line; bit lines coupled to the memory cells; column switches that couple the bit lines to data lines, respectively; a column selection line disposed along the word line that transmits a column selection signal for controlling each column switch; and at least one column repeater circuit disposed on the column selection line that outputs the column selection signal in synchronization with the first dummy word line signal input to the first dummy repeater circuit.

16 Claims, 22 Drawing Sheets

SEMICONDUCTOR MEMORY AND SYSTEM

CROSS-REFERENCE TO RELATED APPLICATIONS

This application claims the benefit of priority from Japanese Patent Application No. 2009-115452 filed on May 12, 2009, the entire contents of which are incorporated herein by reference.

BACKGROUND

1. Field

The embodiment discussed herein relates to a semiconductor memory and a system.

2. Description of Related Art

For example, in a semiconductor memory, if a timing of when data is read from memory cells based on an activation of a word line differs from a timing of when a sense amplifier is activated, an operation margin may decline.

Related technologies are disclosed in, for example, Japanese Laid-open Patent Publication Nos. 2005-506645, 2005-267744, and S63-44400.

SUMMARY

According to one aspect of the embodiments, a semiconductor memory is provided which includes a word line coupled to memory cells and configured to transmit a word line signal, at least one word repeater circuit including a first load circuit that is disposed on the word line, a first dummy word line disposed along the word line and configured to transmit a first dummy word line signal, at least one dummy repeater circuit including a second load circuit that is disposed on the first dummy word line, bit lines coupled to the memory cells, column switches configured to couple the bit lines to data lines, respectively, a column selection line disposed along the word line and configured to transmit a column selection signal for controlling each column switch, and at least one column repeater circuit disposed on the column selection line and configured to output the column selection signal in synchronization with the first dummy word line signal input to the first dummy repeater circuit.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DESCRIPTION

In the following descriptions, many of the exemplary aspects are shown to include n-channel metal-oxide-semiconductor field-effect transistors (MOSFETs) in a variety of configurations. While MOSFET devices are used as an example, the disclosed circuits may be implemented using any number of other transistor types, such as J-FETs and bipolar transistors, among others. Additionally, while n-channel devices are used in the following exemplary aspects, the same general approaches may also apply to circuits incorporating p-channel FETs or PNP bipolar transistors, for example.

Further, while terms "drain" and "source" are used for ease of explanation and to adhere to traditional engineering usage, it should be recognized that a drain and source of a FET transistor may be considered interchangeable, and for the following descriptions merely thought of as a first end and a second end of a semiconductor channel unless otherwise stated or apparent to one of ordinary skill in the art.

Still further, in the Figures of the various exemplary aspects, signal lines illustrated in bold indicate that a plurality of signal lines are provided. A portion of a block to which the bold line is coupled includes a plurality of circuits. Signal lines are labeled with reference symbols representing names of signals transmitted through the signal lines. A signal having a reference symbol suffixed with a letter "Z" indicates a positive logic. A signal having a reference symbol prefixed with a symbol "/" and a signal having a reference symbol suffixed with a letter "X" indicate a negative logic. A double-square symbol represents an external terminal such as a pad on a semiconductor chip or a lead of a package containing the semiconductor chip therein. Terminals and signals supplied through the terminals, respectively, are denoted by like reference symbols.

In semiconductor memories, such as static random access memories (SRAMs), a high-level voltage of word lines may be reduced in order to improve a data holding characteristic of memory regardless of miniaturization of element structures. Consequently, the transmission delay time of a word line signal may increase and the operation margin may decline.

When a large number of memory cells are coupled to the word lines, the operation margin may vary depending on the positions of the memory cells.

Figure 1:
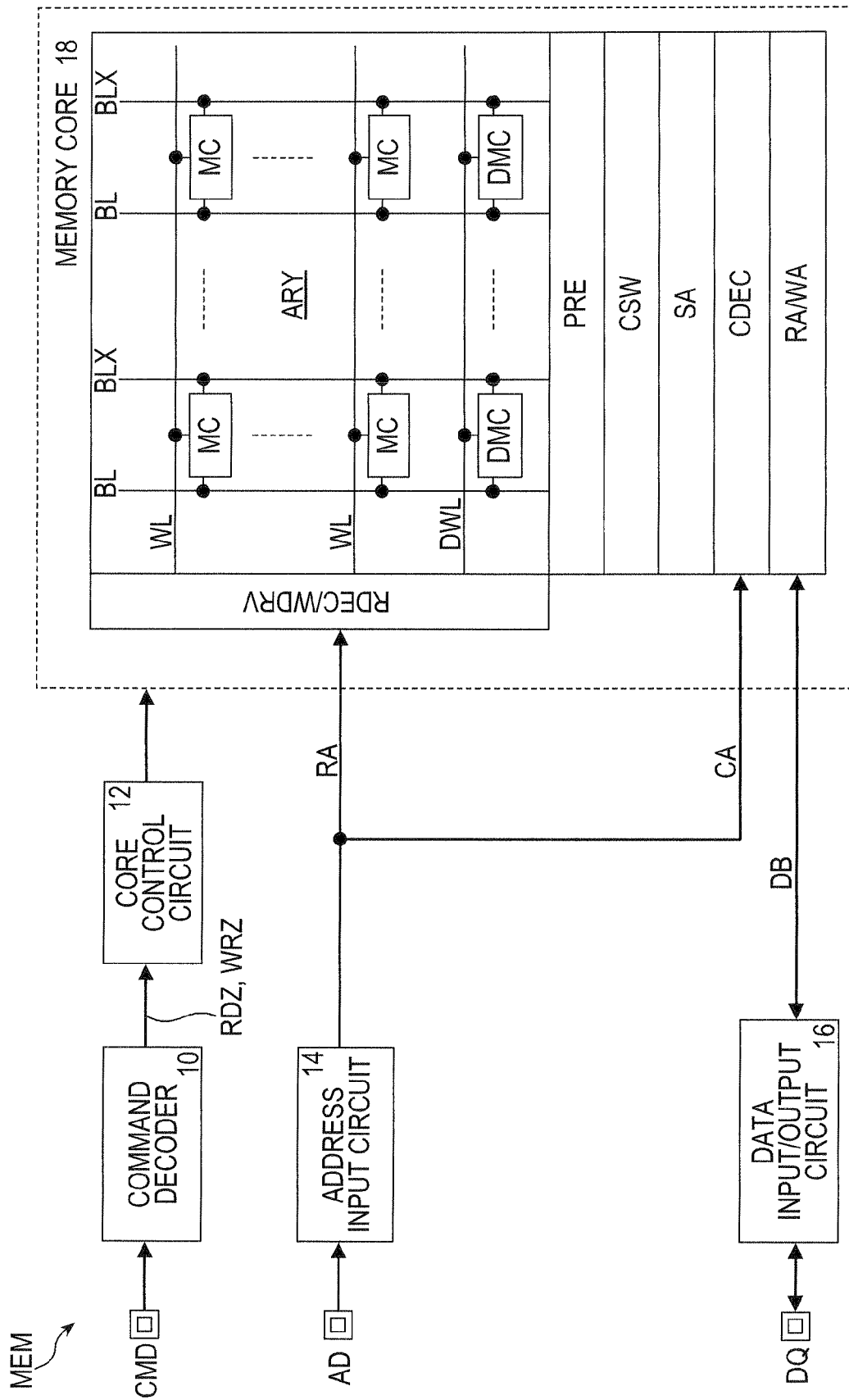
FIG. 1 illustrates a semiconductor memory in accordance with an exemplary aspect.

FIG. 1 illustrates a semiconductor memory in accordance with an exemplary aspect. A semiconductor memory MEM may be, for example, an SRAM. The semiconductor memory MEM may operate in synchronization with a clock signal or may operate asynchronously with the clock signal. The semiconductor memory MEM may include a memory macro (IP) to be provided in a system LSI (large scale integration) or the like, and may include a semiconductor storage device enclosed in a package.

The semiconductor memory MEM includes a command decoder 10, a core control circuit 12, an address input circuit 14, a data input/output circuit 16, and a memory core 18. The semiconductor memory MEM may operate in response to, for example, a 1.1 V power-supply voltage VDD.

The command decoder 10 decodes a command signal CMD for the memory core 18 and outputs a read signal RDZ or a write signal WRZ. For example, the command signal CMD may include a chip select signal, an output enable signal, oar a write enable signal.

Figure 5:
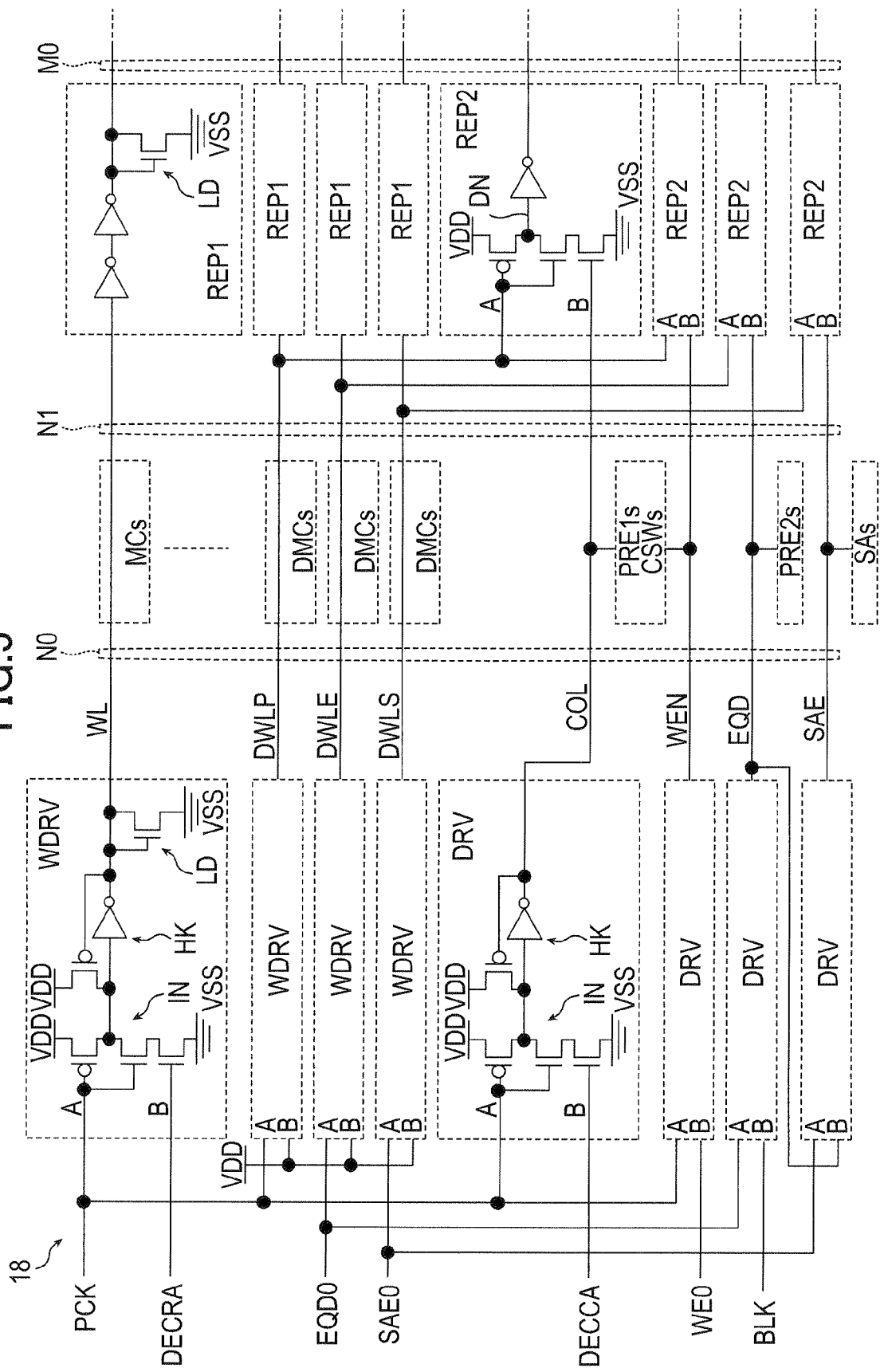
FIG. 5 illustrates a memory core in accordance with an exemplary aspect.

In response to the read signal RDZ or the write signal WRZ output from the command decoder 10, the core control circuit 12 outputs a control signal (a timing signal) for operating the memory core 18. For example, the control signal may include a clock signal PCK, an equalizer signal EQD0, a sense amplifier enable signal SAE0, or a write enable signal WE0, as illustrated in FIG. 5.

The address input circuit 14 outputs address signals received at an address terminal AD as a row address signal RA and a column address signal CA. A line WL is selected based on the row address signal RA. A pair of bit lines BL and BLX is selected for each data terminal DQ based on the column address signal CA, so that a memory cell MC is accessed.

During a write operation, the data input/output circuit 16 outputs write data, which is supplied from the data terminal DQ, to a memory cell array ARY through a data bus DB and a write amplifier WA. During a read operation, the data input/output circuit 16 outputs read data, which is output from the memory cell array ARY through a read amplifier RA and the data bus DB, to the data terminal DQ. The data terminal DQ may be, for example, a 72-bit data terminal.

The memory core 18 includes row decoders RDEC, word line drivers WDRV, precharge circuits PRE, column switches CSW, sense amplifiers SA, and column decoders CDEC, in addition to the read amplifiers RA, the write amplifiers WA, and the memory cell array ARY.

The row decoder RDEC decodes the row address signal RA and activates a row decode signal DECRA for selecting the word line WL. The word line drivers WDRV are provided so as to correspond to the word lines WL. The word line driver WDRV that receives the activated row decode signal DECRA sets the corresponding word line WL to a high level.

In a standby period in which the command signal CMD is not supplied, the precharge circuits PRE set all bit lines BL and BLX and all read data lines RD and RDX to high levels. In an active period in which the command signal CMD is supplied, the precharge circuits PRE set the bit lines BL and BLX and read data lines RD and RDX of the memory blocks that are not accessed to the high levels. The active period includes a write access period in which a write operation is executed and a read access period in which a read operation is executed.

The column switches CSW are provided so as to correspond to the pairs of bit lines BL and BLX. The column switch CSW that receives a high-level column selection signal COL is turned on, so that the corresponding pair of bit lines BL and BLX is coupled to the write amplifier WA or the sense amplifier SA. During the read operation, the sense amplifier SA amplifies a voltage difference between complementary read data signals transmitted from the bit lines BL and BLX to the read data lines RD and RDX.

The column decoder CDEC decodes the column address signal CA and activates a column decode signal DECCA for selecting the pair of bit lines BL and BLX for each data terminal DQ. The timing-adjusted column decode signal DECCA is supplied to the column switch CSW as the column selection signal COL. During the read operation, the read amplifier RA amplifies the complementary read data signal output via the column switch CSW. During the write operation, the write amplifier WA outputs the write data, which is supplied from the data bus DB, to the pair of bit lines BL and BLX via the column switch CSW as the complementary write data signal.

Figure 4:
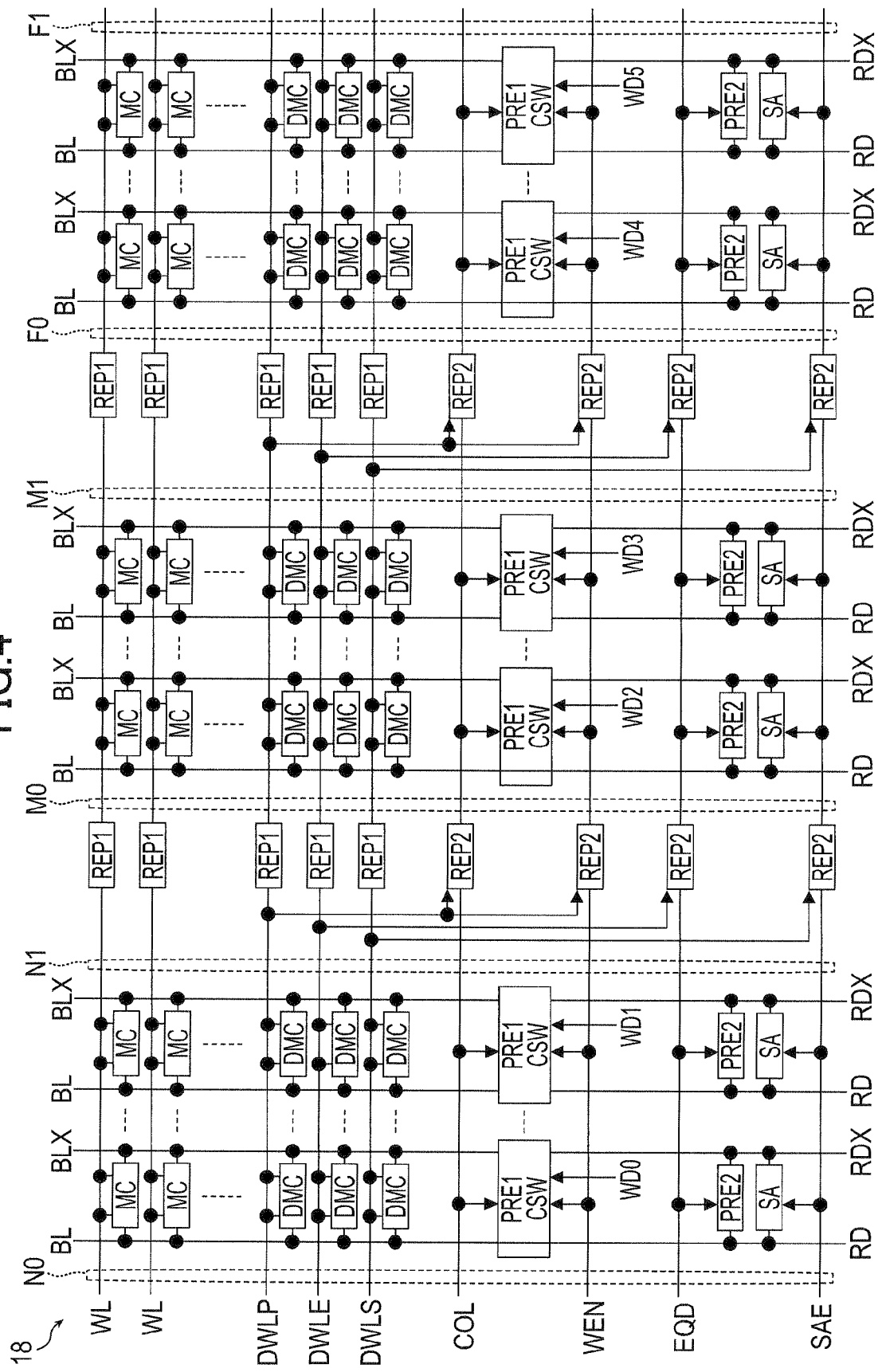
FIG. 4 illustrates sub column selection lines, sub equalizer signal lines, and sub sense amplifier enable signal lines in accordance with an exemplary aspect.

The memory cell array ARY includes static memory cells MC and dummy memory cells DMC which are arranged in a matrix. The static memory cells MC arranged in the horizontal direction in the drawing are coupled to a common word line WL. The dummy memory cells DMC arranged in the horizontal direction in the drawing are coupled to a common dummy word line DWL. For example, as illustrated in FIG. 4, three dummy word lines DWLP, DWLE, and DWLS may be provided as the dummy word line DWL. The memory cells MC and DMC arranged in the horizontal direction in the drawing are coupled to the common pair of bit lines BL and BLX. The memory cells MC may be real memory cells that hold write data received at the data terminal DQ. The dummy memory cells DMC may hold logical "0".

Figure 2:
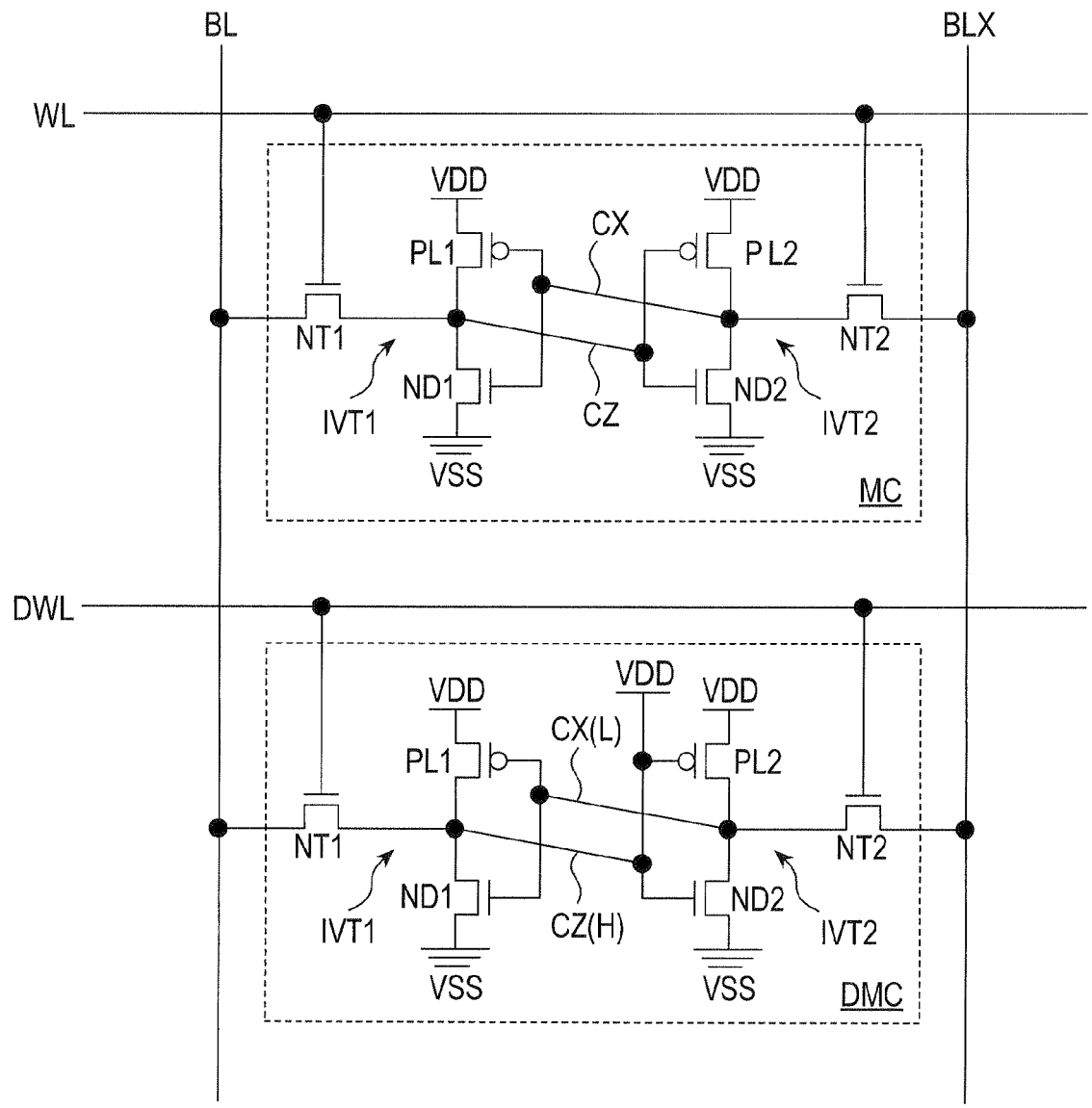
FIG. 2 illustrates a memory cell and a dummy memory cell in accordance with an exemplary aspect.

FIG. 2 illustrates a memory cell and a dummy memory cell in accordance with an exemplary aspect. The memory cell MC and the dummy memory cell DMC illustrated in FIG. 2 may be the memory cell MC and the dummy memory cell DMC illustrated in FIG. 1. A transistor denoted by a reference character starting with "P" represents a p-channel metal oxide semiconductor (pMOS) transistor. A transistor denoted by a reference character starting with "N" represents a n-channel metal oxide semiconductor (nMOS) transistor.

The memory cell MC includes a pair of CMOS inverters IVT1 and IVT2 and a pair of transfer transistors NT1 and NT2. An input and an output of the CMOS inverter IVT1 are coupled with an output and an input of the CMOS inverter IVT2, respectively. The inverter IVT1 includes a load transistor PL1 and a driver transistor ND1. The inverter IVT2 includes a load transistor PL2 and a driver transistor ND2. The output of the inverter IVT1 is coupled to the input of the inverter IVT2 via a storage node CZ. The output of the inverter IVT2 is coupled to the input of the inverter IVT1 via a storage node CX. Gates of the transfer transistors NT1 and NT2 are coupled to the word line WL.

The storage node CZ is a positive-logic storage node for the memory cell MC. The storage node CX is a negative-logic storage node for the memory cell MC. When logical "1" is stored in the memory cell MC, the storage node CZ holds logical "1" and the storage node CX holds logical "0".

The configuration of the dummy memory cell DMC may be the same as or similar to the configuration of the real memory cell MC. The dummy memory cell DMC has a layout in which an input node CZ of an inverter IVT2 is coupled to a power supply line VDD. The dummy memory cell DMC holds logical "1", for example, a high level in the storage node CZ and logical "0", for example, a low level in the storage node CX. An input of the IVT1 of the dummy memory cell DMC may also be coupled to the power supply line VDD. Gates of the transfer transistors NT1 and NT2 of the dummy memory cell DMC are coupled to the dummy word line DWL.

Figure 3:
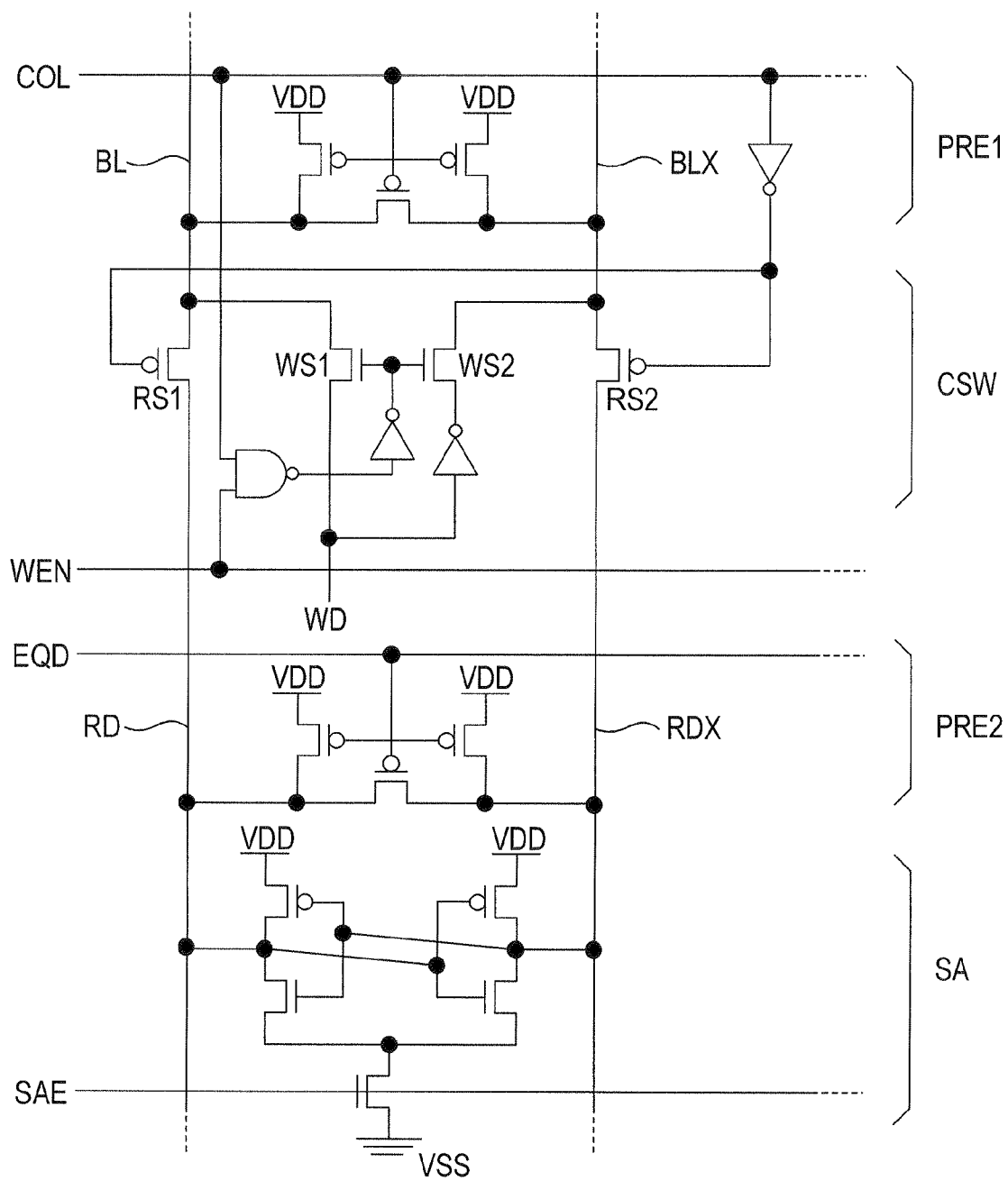
FIG. 3 illustrates a precharge circuit, a column switch, and a sense amplifier in accordance with an exemplary aspect.

FIG. 3 illustrates a precharge circuit, a column switch, and a sense amplifier in accordance with an exemplary aspect. The precharge circuit PRE, the column switch CSW, and the sense amplifier SA illustrated in FIG. 3 may be the precharge circuit PRE, the column switch CSW, and the sense amplifier SA illustrated in FIG. 1. The precharge circuit PRE includes a precharge circuit PRE1, which is coupled to a pair of bit lines BL and BLX, and a precharge circuit PRE2, which is coupled to a pair of read data lines RD and RDX.

The precharge circuit PRE1 includes pMOS transistors, which couple the corresponding bit lines BL and BLX to the power supply line VDD, and a pMOS transistor, which inter-couples the bit lines BL and BLX. The precharge circuit PRE1 precharges the complementary bit lines BL and BLX to the power supply voltage VDD, while receiving a low-level column selection signal COL.

The column switch CSW includes read switches RS1 and RS2 and write switches WS1 and WS2. For example, the read switches RS1 and RS2 may be pMOS transistors and the write switches WS1 and WS2 may be nMOS transistors. When the column selection signal COL is activated to a high level, the read switch RS1 is turned on to couple the bit line BL to the read data line RD. When the column selection signal COL is activated to a high level, the read switch RS2 is turned on to couple the bit line BLX to the read data line RDX.

When both of the column selection signal COL and a write enable signal WEN are activated to high levels, the write switch WS1 is turned on to supply write data WD to the bit line BL. When both of the column selection signal COL and the write enable signal WEN are activated to high levels, the write switch WS2 is turned on to supply inverted logic of the write data WD to the bit line BLX. The read switches RS1 and RS2 and the write switches WS1 and WS2 may include CMOS transmission gates.

The precharge circuit PRE2 includes pMOS transistors, which couple the corresponding read data lines RD and RDX to the power supply line VDD, and a pMOS transistor, which inter-couples the read data lines RD and RDX. The precharge circuit PRE2 precharges the complementary read data lines RD and RDX to the power supply voltage VDD, while receiving a low-level equalizer signal EQD.

The sense amplifier SA includes a pair of CMOS inverters and an nMOS transistor. An input and an output of one of the CMOS inverters are coupled with an output and an input of the other CMOS inverter, respectively. The nMOS transistor is provided between the pair of CMOS inverters and a ground line VSS and receives a sense amplifier enable signal SAE at a gate. The sense amplifier SA operates while the sense amplifier enable signal SAE is at the high level, to amplify a difference between the voltages of the read data lines RD and RDX.

FIG. 4 illustrates a memory core in accordance with an exemplary aspect. The memory core illustrated in FIG. 4 may be the memory core 18 illustrated in FIG. 1. Each word line WL is divided into four word lines, for example, sub word lines, by interposing three repeater circuits REP1 therebetween. In FIG. 4, three sub-word lines WL-N, WL-M, and WL-F are disposed in the vicinity of the word line driver WDRV illustrated in FIG. 1. Nodes of the sub word lines WL-N, WL-M, and WL-F are denoted by N0, N1, M0, M1, F0, and F1, depending on the arrangement position of the sub word line. For example, the node denoted by the character ending with "0" may be located at an end that is closer to the word line driver WDRV. For example, the node denoted by a character ending with "1" may be located at an end that is farther from the word line driver WDRV.

The sub word lines WL-N, WL-M, and WL-F may correspond to data terminals DQ0 to DQ17, DQ18 to DQ35, and DQ36 to DQ53 (not illustrated), respectively. The sub word line, which is coupled to the sub word line WL-F via the repeater circuit REP1 and disposed farthest from the word line driver WDRV, may correspond to data terminals DQ54 to DQ71 (not illustrated). Sixteen memory cells MC, which are specified by column address signals CA, are coupled to each sub word line for each terminal DQ. Thus, a total of 288 memory cells MC are coupled to each sub word line. For example, the repeater circuits REP1 disposed along the word line WL may be arranged at intervals of 288 memory cells MC arranged along the word line WL. During the write operation or the read operation, 16 memory cells MC are selected for each of the sub word lines WL-N, WL-M, and WL-F in response to the column address signal CA and data is input or output.

Each repeater circuit REP1 may be a buffer circuit for driving the sub word line disposed farther from the word line driver WDRV. Since the repeater circuit REP1 is interposed between the sub word lines, the high-level voltage of the word line WL may be reliably and quickly transmitted in the semiconductor memory MEM in which the high-level voltage of the word line WL is set low. The repeater circuit REP1 is effective when the number of memory cells MC coupled to the word line WL is large.

The dummy word line DWLP is divided into four dummy word lines, for example, sub dummy word lines, by interposing three repeater circuits REP1 therebetween. Each of the dummy word lines DWLE and DWLS is also divided into four sub dummy word lines by interposing three repeater circuits REP1 therebetween, similarly to the dummy word line DWLP. The repeater circuit REP1 disposed along the word line WL may be a buffer circuit for driving the next sub word line located farther from the word line driver WDRV. The repeater circuits REP1 disposed along each of the dummy word lines DWLP, DWLE, and DWLS may also be disposed at substantially the same pitch as the repeater circuits REP1 disposed along the word line WL.

The repeater circuits REP1 disposed along the dummy word line DWLP (or DWLE or DWLS) may also be substantially the same as or similar to the repeater circuits REP1 disposed along the word line WL. Each repeater circuit REP1 disposed along the dummy word line DWLP (or DWLE or DWLS) may be a buffer circuit for driving the sub dummy word line located farther from the word line driver WDRV. Since the repeater circuit REP1 is interposed between the sub word lines, the dummy word line signal DWLP (or DWLE or DWLS) is transmitted at a timing that is substantially the same as or close to the timing of a word line signal WL transmitted through the word line WL.

FIG. 4 illustrates a sub dummy word line. The three sub dummy word lines illustrated in FIG. 4 may be the sub dummy word lines disposed in the vicinity of the word line drivers WDRV illustrated in FIG. 1. Nodes of the sub dummy word lines are denoted by N0, N1, M0, M1, F0, and F1, depending on the arrangement position of the sub dummy word line, as the nodes of the sub word line. Each of the sub dummy word lines DWLP-N, DWLP-M, and DWLP-F is coupled to 288 dummy memory cells DMC, as the sub word lines WL-N, WL-M, and WL-F.

The column selection line COL is divided into four sub column selection lines by interposing three repeater circuits REP2 therebetween. The write enable signal line WEN is divided into four sub write enable signal lines by interposing three repeater circuits REP2 therebetween. The equalizer signal line EQD is divided into four sub equalizer signal lines by interposing three repeater circuits REP2 therebetween. The sense amplifier enable signal line SAE is divided into four sub sense amplifier enable signal lines by interposing three repeater circuits REP2 therebetween. The repeater circuits REP2 may be disposed at substantially the same pitch as the repeater circuits REP1 disposed along the word line WL.

Each repeater circuit REP2 provided along the column selection line COL may be a buffer circuit for driving the sub column selection line disposed farther from the driver DRV. Each repeater circuit REP2 disposed along the write enable signal line WEN may be a buffer circuit for driving the sub write enable signal line disposed farther from the driver DRV. Each repeater circuit REP2 disposed along the equalizer signal line EQD may be a buffer circuit for driving the next sub equalizer signal line located farther from the driver DRV. The repeater circuit REP2 disposed along the sense amplifier enable signal line SAE may be a buffer circuit for driving the sub sense amplifier enable signal line disposed farther from the driver DRV.

The sub column selection lines, the sub equalizer signal lines, and the sub sense amplifier enable signal lines illustrated in FIG. 4 may be sub column selection signals, sub equalizer signal lines, and sub sense amplifier enable signal lines disposed in the vicinity of the word line drivers WDRV illustrated in FIG. 1. Reference characters for identifying the sub column selection lines, the sub equalizer signal lines, and the sub sense amplifier enable signal lines may be substantially the same as or similar to the reference characters for the sub word lines. For example, 16 column selection lines COL may be disposed in order to select 16 memory cells for each sub word line. However, for simplicity of description, one column selection line COL is illustrated in FIG. 4.

For example, two repeater circuits REP2 for receiving a sub dummy word line signal DWLP-N1 may be disposed at positions corresponding to the repeater circuits REP1 for receiving word line signals WL-N1. For example, the repeater circuits REP2 for receiving sub dummy word line signals DWLE-N1 and DWLS-N1 may be disposed at positions corresponding to the repeater circuits REP1 for receiving the word line signals WL-N1.

For example, the repeater circuit REP2 that receives a column selection signal COL-N1 may output a column selection signal COL-M0 to the next sub column selection line COL-M0 in synchronization with the dummy word line signal DWLP-N1. For example, the repeater circuit REP2 that receives the write enable signal WEN-N1 may output a write enable signal WEN-M0 to the next write enable signal line WEN-M0 in synchronization with the dummy word line signal DWLP-N1. The repeater circuit REP2 that receives the equalizer signal EQD-N1 outputs an equalizer signal EQD-M0 to the next equalizer signal line EQD-M0 in synchronization with the dummy word line signal DWLE-N1. The repeater circuit REP2 that receives the sense amplifier enable signal SAE-N1 outputs a sense amplifier enable signal SAE-M0 to the next sense amplifier enable signal line SAE-M0 in synchronization with the dummy word line signal DWLS-N1.

FIG. 5 illustrates a memory core in accordance with an exemplary aspect. The memory core illustrated in FIG. 5 may be the memory core 18 illustrated in FIG. 1. Word line drivers WDRV illustrated in FIG. 5 may be substantially the same as or similar to the word line drivers circuit illustrated in FIG. 1. For the sake of simplicity, a description is given of the word line driver WDRV coupled to the sub word line WL-N. The word line driver WDRV includes an input circuit IN, a half keeper HK, and a load circuit LD.

The input circuit IN includes a pMOS transistor and two nMOS transistors which are arranged in series between a power supply line VDD and a ground line VSS. The input circuit IN outputs a high level signal when a clock signal PCK received at an input terminal A is at a low level. The input circuit IN outputs a low level signal when the clock signal PCK and the row decode signal DECRA received at an input terminal B are at high levels. When a high level signal is supplied to the input terminal A of the input circuit IN and a low level signal is supplied to the input terminal B, an output terminal of the input circuit IN are put into a floating state. The input circuit IN may be a dynamic AND circuit.

The half keeper HK includes a CMOS inverter and a pMOS transistor. The CMOS inverter inverts the output signal of the input circuit IN and outputs the inverted signal as a word line signal WL. The pMOS transistor receives the output of the CMOS inverter at a gate. When the word line signal WL is at the low level, the pMOS transistor is turned on. Thus, the output of the input circuit IN is coupled to the power supply line VDD and the word line signal WL is held at the low level.

The load circuit LD includes an nMOS transistor disposed between the word line WL and a ground line VSS. When the high-level voltage of the word line WL is higher than a threshold voltage of the nMOS transistor, the nMOS transistor is turned on. The high-level voltage of the word line WL becomes lower than the power supply voltage VDD, so that data held by the memory cells MC may not be lost. The logical data "0" held in the memory cells MC by precharge voltages of the bit lines BL and BLX may not invert when the transfer transistors NT1 and NT2 are turned on upon activation of the word line WL.

The drivers DRV, which is coupled to the sub column selection line COL-N, the sub write enable signal line WEN-N, the sub equalizer signal line EQD-N, and the sub sense amplifier enable signal line SAE-N, may be disposed in, for example, the layout area of the word line drivers WDRV illustrated in FIG. 1. The drivers DRV may have substantially the same configuration or similar circuit configurations. The configurations of the drivers DRV may be substantially the same as or similar to the configuration of the word line driver WDRV, but may not include the load circuit LD.

The repeater circuit REP1 includes two CMOS inverters coupled in series and a load circuit LD coupled to an output of the CMOS inverter at the subsequent stage. Since the load circuit LD causes the high-level voltage of the word line WL to become lower than the power supply voltage VDD, data held by the memory cells MC may not be lost. The repeater circuit REP2 includes an input circuit IN and a CMOS inverter which are coupled in series. When a high level signal is supplied to an input terminal A of the input circuit IN and a low level signal is supplied to an input terminal B, a dynamic node DN that corresponds to an output terminal of the input circuit IN is put into a floating state.

The word line driver WDRV for outputting a dummy word line signal DWLP-N0 and the driver DRV for outputting a column selection line COL-N0 operate in synchronization with the clock signal PCK. The dummy word line signal DWLP-N0 is output at substantially the same timing as output timing of a word line signal WL-N0. The activation timing of the dummy word line signal DWLP-N0 and the word line signal WL-N0 are delayed by the load circuit LD relative to the activation timing of the column selection signal COL-N0. The column selection signals COL-N0 and COL-N1 are output earlier than the word line signals WL-N0 and WL-N1.

When a high-level dummy word line signal DWLP and a high-level column selection signal COL-N1 are supplied to the repeater circuit REP2 coupled to the column selection line COL-N, the repeater circuit REP2 outputs a high-level column selection signal COL-M0. Since the repeater circuit REP2 operates in synchronization with the dummy word line signal DWLP-N1, the activation timing of the column selection signal COL-M0 becomes substantially the same as the activation timing of a word line signal WL-N1. Thus, when the column selection signal COL is transmitted via the repeater circuit REP2 having no load circuit LD, the activation timing of the column selection signal COL may not be advanced. When the word line signal WL is transmitted via the plurality of repeater circuits REP1, the activation timing of the sub column selection signal COL disposed farther from the driver DRV may not be advanced relative to the activation timing of the word line signal WL. The same applies to the write enable signal WEN, the precharge signal EQD, and the sense amplifier enable signal SAE.

Figure 6:
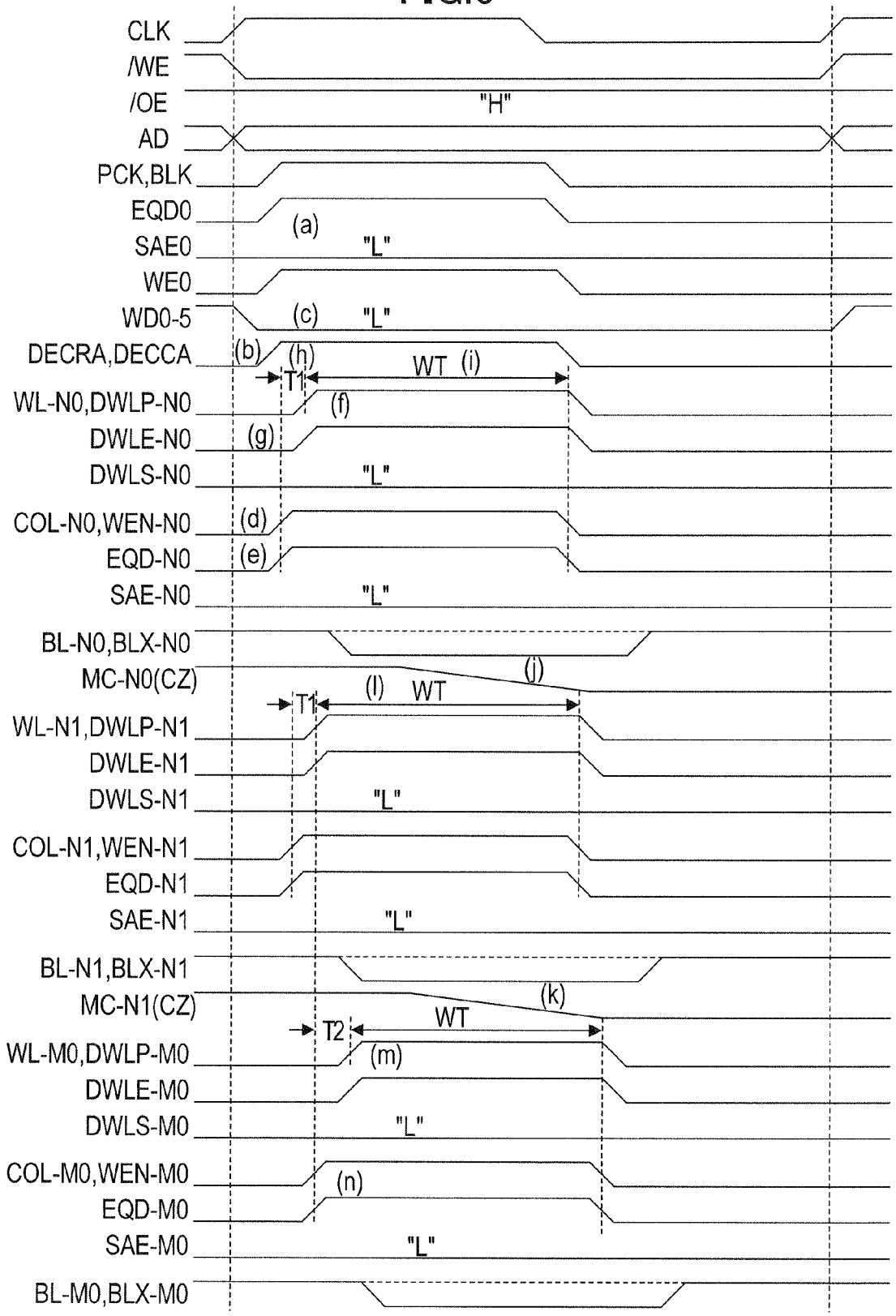
FIG. 6 illustrates a write operation of a semiconductor memory in accordance with an exemplary aspect.
Figure 7:
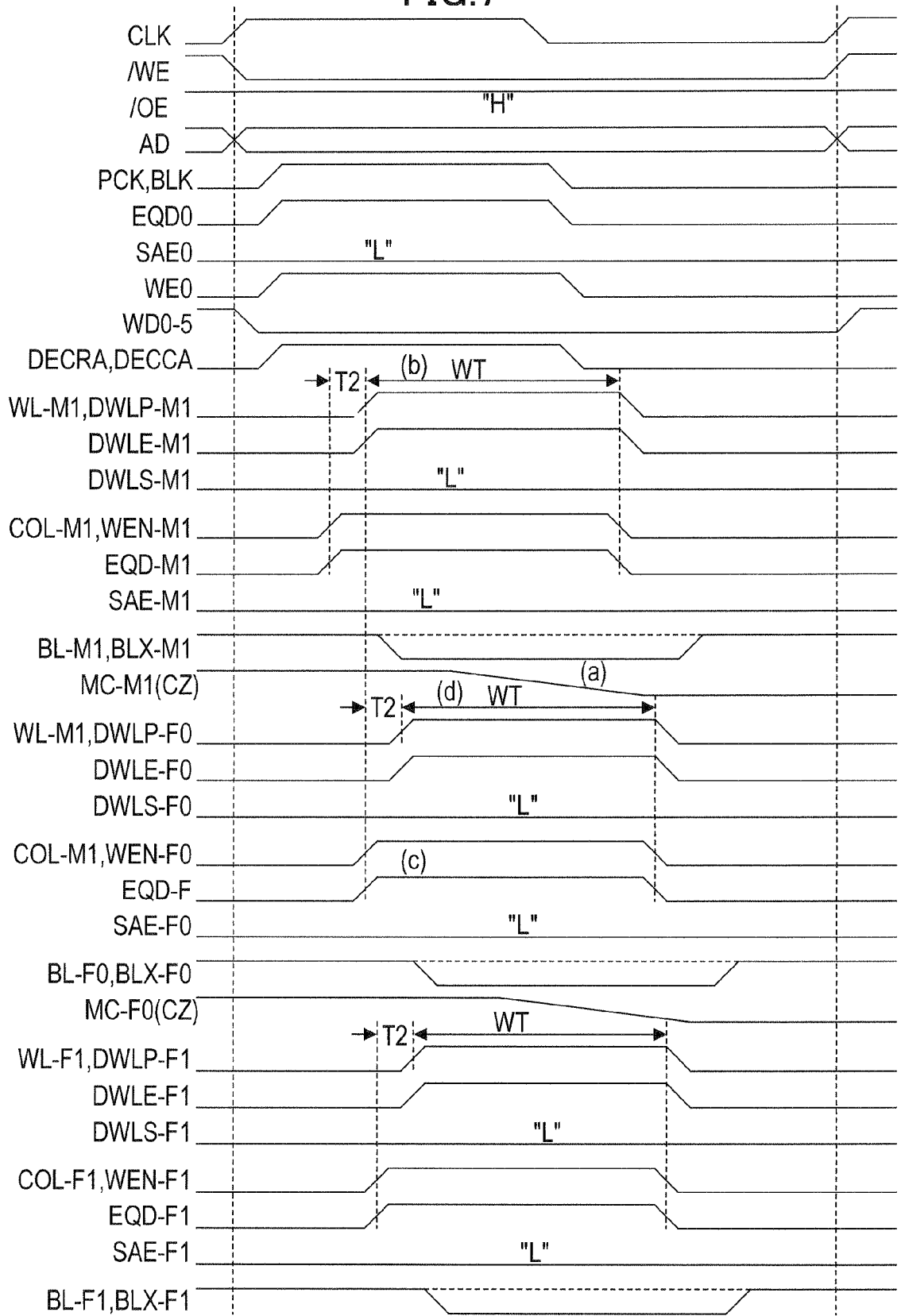
FIG. 7 illustrates a write operation of a semiconductor memory in accordance with an exemplary aspect.

FIGS. 6 and 7 illustrate a write operation of a semiconductor memory in accordance with an exemplary aspect. The semiconductor memory illustrated in FIGS. 6 and 7 may be the semiconductor memory MEM illustrated in FIG. 1. FIG. 6 illustrates an operation from the node N0 to the node M0 illustrated in FIG. 4. FIG. 7 illustrates an operation from the node M1 to the node F1 illustrated in FIG. 4. The waveforms of a clock signal CLK, a row decode signal DECRA, and a column decode signal DECCA illustrated in FIG. 7 may be substantially the same waveforms as those illustrated in FIG. 6. The semiconductor memory MEM executes a write operation in one cycle of the clock signal CLK. When the semiconductor memory MEM operates asynchronously with the clock, a clock signal PCK is generated in synchronization with a write command. For example, before a write operation, all memory cells MC may hold data of logical "1".

A controller for accessing the semiconductor memory MEM outputs the write command, write data, and an address signal AD to the semiconductor memory MEM in synchronization with the rising edge of the clock signal CLK. The address signal AD indicates the memory cell MC to which the data is to be written. For example, the command decoder 10 illustrated in FIG. 1 may recognize the write command upon receiving a low-level write enable signal /WE and a high-level output enable signal /OE in synchronization with an internal clock signal delayed from the clock signal CLK.

The core control circuit 12 outputs the clock signal PCK having substantially the same waveform as the clock signal CLK, a block selection signal BLK, an equalizer signal EQD0, and a write enable signal WE0, and holds a sense amplifier enable signal SAE0 at the low level ((a) in FIG. 6). The memory core 18 includes a plurality of memory blocks. The block selection signal BLK, the equalizer signal EQD0, and the write enable signal WE0 are supplied to the memory block on which the write operation is performed, in accordance with a row address signal RA.

The row decoder RDEC illustrated in FIG. 1 outputs one of the row decode signals DECRA in accordance with the row address signal RA. A number of row decode signals DECRA may be equal to the number of word lines WL. The column decoder CDEC illustrated in FIG. 1 outputs one of the column decode signals DECCA in accordance with the column address signal CA. For example, a number of column decode signals DECCA may be 16 for each memory block. The row decode signals DECRA and the column decode signals DECCA are output in synchronization with the clock signal CLK ((b) in FIG. 6).

The write amplifier WA illustrated in FIG. 1 outputs write data WD0-5, which is supplied to the data terminal DQ, to the column switch CSW ((c) in FIG. 6). For ease of description, the write data WD0-5 may have logical "0" (low level). In FIG. 6, the write data WD0-5 has six bits so as to correspond to the configuration in FIG. 4. The write amplifier WA outputs 72-bit write data to the memory cell array ARY in response to each write command.

The driver DRV that receives the column decode signal DECCA outputs a column selection signal COL-N0 in synchronization with the clock signal PCK ((d) in FIG. 6). The driver DRV that receives a write enable signal WE0 outputs a write enable signal WEN-N0 in synchronization with the clock signal PCK. Since the write enable signal WEN-N0 is output at substantially the same timing as the column selection signal COL-N0, the waveform of the write enable signal WEN-N0 is expressed by substantially the same waveform as the column selection signal COL-N0. The driver DRV that receives an equalizer signal EQD0 outputs an equalizer signal EQD-N0 in synchronization with the block selection signal BLK ((e) in FIG. 6).

The word line driver WDRV that receives the row decode signal DECRA outputs the word line signal WL-N0 in response to the clock signal PCK ((f) in FIG. 6). The word line driver WDRV that receives the clock signal PCK outputs a dummy word line signal DWLP-N0 in response to the clock signal PCK. Since the dummy word line signal DWLP-N0 is output at substantially the same timing as the word line signal WL-N0, the waveform of the dummy word line signal DWLP-N0 is expressed by substantially the same waveform as the word line signal WL-N0. The word line driver WDRV that receives the equalizer signal EQD0 outputs a dummy word line signal DWLE-N0 in response to the clock signal PCK ((g) in FIG. 6).

The word line driver WDRV for outputting the word line signal WL-N0 and the dummy word line signals DWLP-N0 and DWLE-N0 includes a load circuit LD. Thus, the rising edges of the word line signal WL-N0 and the dummy word line signals DWLP-N0 and DWLE-N0 are delayed by the amount of T1 from the rising edges of the column selection signal COL-N0, the write enable signal WEN-N0, and the equalizer signal EQD-N0 ((h) in FIG. 6). A write operation time WT of the memory cell MC disposed in the vicinity of the node N0 may be a period of time from the rising edge of the word line signal WL-N0 to the falling edge of the column selection signal COL-N0 ((i) in FIG. 6).

During the write operation, for example, low-level write data WD0-5 may be transmitted to a bit line BL-N0 by turning on of the write switches WS1 and WS2 and may be written to the memory cell MC-N0. The storage node CZ of the memory cell MC-N0 changes from the high level to the low level ((j) in FIG. 6). A solid line illustrated at the bit lines BL-N0 and BLX-N0 represents the bit line BL-N0 and a broken line represents the bit line BLX-N0.

In particular, the write operation of the memory cell MC-N1 disposed farther from the word line driver WDRV may be substantially the same as or similar to the above-described write operation of the memory cell MC-N0, but the operation timing of the memory cell MC-N1 may be slightly delayed by loads such as wiring lines ((k) in FIG. 6). A write operation time WT of the memory cell MC disposed in the vicinity of the node N1 may be substantially the same as the write operation time WT of the memory cell MC disposed in the vicinity of the node N0 ((l) in FIG. 6).

In the write operation of the memory cell MC disposed in the vicinity of the node M0, a word line signal WL-M0 is transmitted from the node N1 side via the repeater circuit REP1. The repeater circuit REP1 includes the load circuit LD. Thus, the rising edge of the word line signal WL-M0 is delayed by an amount of time T2 from the rising edge of the word line signal WL-N1 in FIG. 6). The rising edge timing of dummy word line signals DWLP-M0 and DWLE-M0 transmitted via the repeater circuit REP1 may be substantially the same as the rising edge timing of the word line signal WL-M0.

The repeater circuit REP2 coupled to the node N1 operates in response to one of the dummy word line signals DWLP-N1 and DWLE-N1. The column selection signal COL-M0, the write enable signal WEN-M0, and the equalizer signal EQD-M0 change to the high levels in synchronization with the rising edges of the dummy word line signal DWLP-N1 and DWLE-N1 ((n) in FIG. 6). Thus, the activation timing of the column selection signal COL-M0 and the write enable signal WEN-M0 and the deactivation timing of the equalizer signal EQD-M0 may be advanced by an amount of time T2 from the activation timing of the word line signal WL-M0.

The transmission delay time of the rising edge of the repeater circuit REP2 that does not include the load circuit LD may be shorter than the transmission delay time of the rising edge of the repeater circuit REP1 including the load circuit LD. However, since the repeater circuits REP2 operate in synchronization with the dummy word line signals DWLP-N1 and DWLE-N1, the column selection signal COL-M0, the write enable signal WEN-M0, and the equalizer signal EQD-M0 are not output earlier. Thus, the activation timing of the column selection signal COL-M0 and the write enable signal WEN-M0 and the deactivation timing of the equalizer signal EQD-M0 are delayed so as to correspond to the activation timing of the word line signal WL-M0. The output timing of the signal output from the repeater circuit REP2 that does not include the load circuit LD is delayed so as to correspond to the output timing of the signal output from the repeater circuit REP1 that includes the load circuit LD. Thus, the write operation time WT of the memory cell MC disposed in the vicinity of the node M0 becomes substantially the same as the write operation time WT of the memory cell MC disposed in the vicinity of the node N0 or N1. Consequently, a decline in the write-operation margin may be reduced.

In FIG. 7, the write operation of the memory cell MC-M1 disposed farther from the word line driver WDRV than the memory cell MC-M0 may be substantially the same as the above-described write operation of the memory cell MC-M0. However, the operation timing of the memory cell MC-M1 may be slightly delayed by loads such as wiring lines ((a) in FIG. 7). The write operation time WT of the memory cell MC disposed in the vicinity of the node M1 may be substantially the same as the write operation time WT of the memory cell MC disposed in the vicinity of the node M0 ((b) in FIG. 7).

In the write operation of the memory cell MC disposed in the vicinity of the node F0, a column selection signal COL-F0, a write enable signal WEN-F0, and an equalizer signal EQD-F0 change to the high levels in synchronization with the rising edges of the dummy word line signals DWLP-M1 and DWLE-M1 ((c) in FIG. 7). The rising edge of the word line signal WL-F0 may be delayed by an amount of time T2 from the rising edge of the word line signal WL-M1 because of an influence of the load circuit LD in the repeater circuit REP1 ((d) in FIG. 7). The activation timing of the column selection signal COL-F0 and the write enable signal WEN-F0 and the deactivation timing of the equalizer signal EQD-F0 are advanced by an amount of time T2 from the activation timing of the word line signal WL-F0. Thus, the write operation time WT of the memory cell MC disposed in the vicinity of the node F0 becomes substantially the same as the write operation time WT of the memory cells MC disposed in the vicinity of the nodes M0 and M1. The write operation time WT of the memory cell MC disposed in the vicinity of the node F1 and the write operation time WT of the memory cell MC disposed farther than the node F1 become substantially the same.

The repeater circuits REP2 that operate in synchronization with the dummy word line signals DWLP and DWLE is disposed along the transmission paths of the write enable signal WEN and the equalizer signal EQD. A period in which the write enable signal WEN and the equalizer signal EQD are at the high levels may include a period in which the column selection signal COL is at the high level, and may be set longer than the period in which the column selection signal COL is at the high level. In such a case, the repeater circuit REP2 may be eliminated. In the write operation, the timing of the column selection signal COL may be adjusted to improve the write operation margin.

Figure 8:
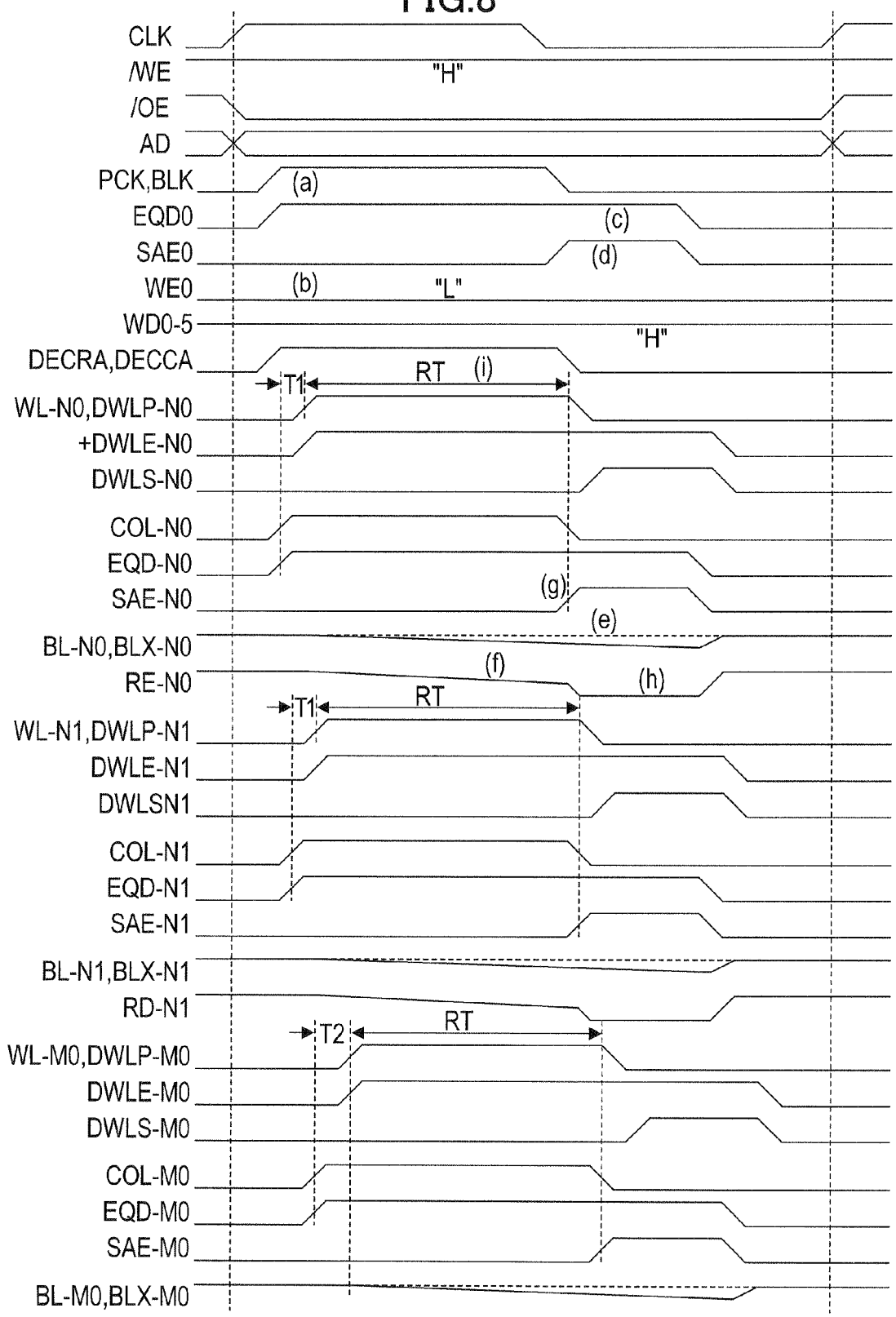
FIG. 8 illustrates a read operation of a semiconductor memory in accordance with an exemplary aspect.
Figure 9:
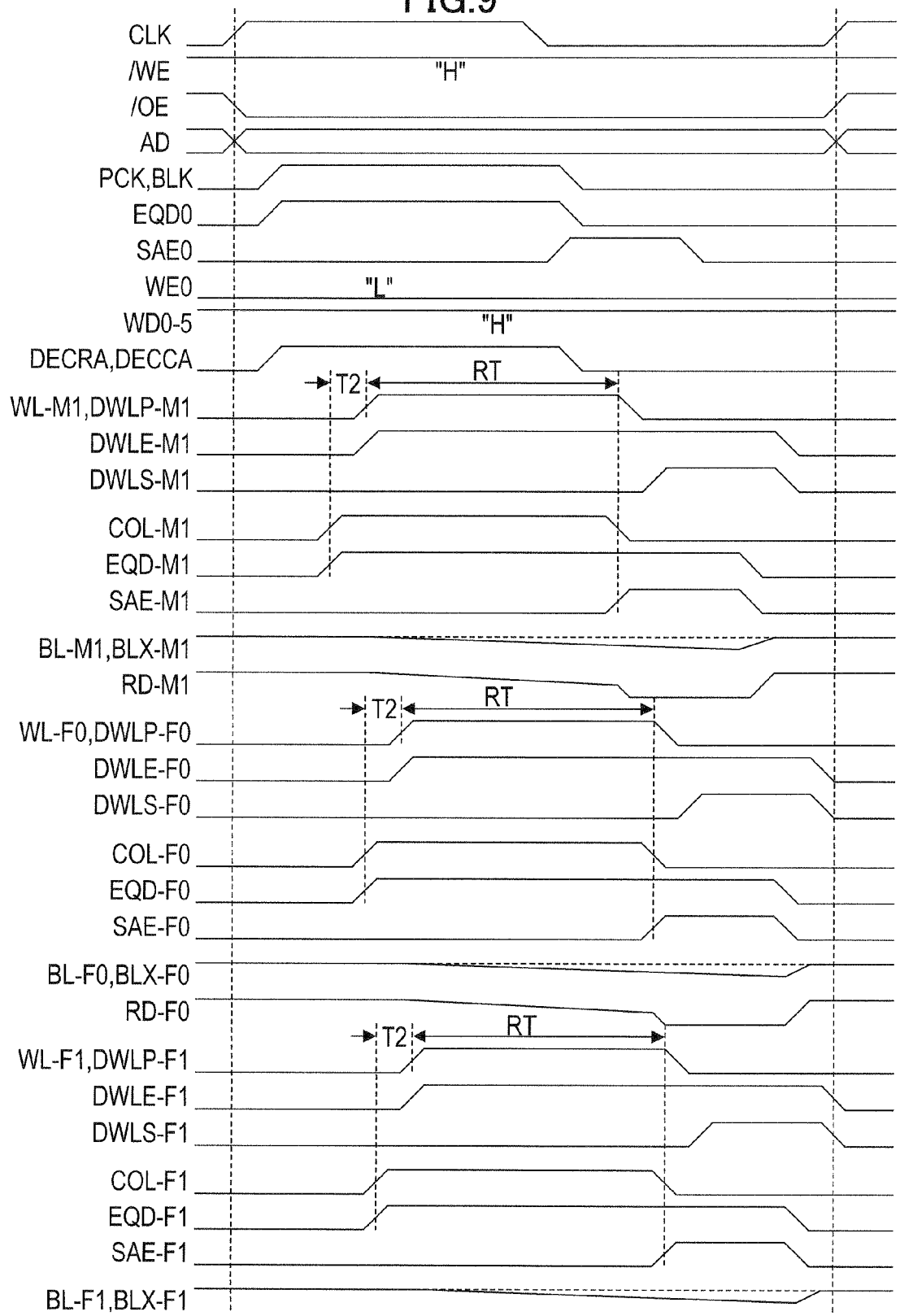
FIG. 9 illustrates a read operation of a semiconductor memory in accordance with an exemplary aspect.

FIGS. 8 and 9 illustrate a read operation of a semiconductor memory in accordance with an exemplary aspect. The semiconductor memory MEM illustrated in FIG. 1 may perform the read operation illustrated in FIGS. 8 and 9. In FIGS. 8 and 9, descriptions of operations that are substantially the same as or similar to the operations in FIGS. 6 and 7 are omitted or reduced. FIG. 8 may illustrate, for example, the operation from the node N0 to the node M0 illustrated in FIG. 4. FIG. 9 may illustrate, for example, the operation from the node M1 to the node F1 illustrated in FIG. 4. The waveforms of the clock signal CLK to the row decode signal DECRA and the column decode signal DECCA illustrated in FIG. 9 may be substantially the same as or similar to those illustrated in FIG. 8. The semiconductor memory MEM reads in one cycle of the clock signal CLK. For example, before the read operation, all memory cells MC may hold data of logical "0".

The controller for accessing the semiconductor memory MEM outputs a read command and an address signal AD indicating a memory cell to be read to the semiconductor memory MEM in synchronization with the rising edge of the clock signal CLK. For example, the command decoder 10 illustrated in FIG. 1 may recognize the read command upon receiving a high-level write enable signal /WE and a low-level output enable signal /OE in synchronization with an internal clock signal obtained by delaying the clock signal CLK.

The core control circuit 12 outputs a clock signal PCK and the block selection signal BLK at timing that is substantially the same as the timing illustrated in FIG. 6 ((a) in FIG. 8). The core control circuit 12 holds the write enable signal WE0 at the low level ((b) in FIG. 8). The core control circuit 12 outputs an equalizer signal EQD0, a falling edge timing of which is delayed from that of the equalizer signal EQD0 in FIG. 6 ((c) in FIG. 8). The core control circuit 12 holds the sense amplifier enable signal SAE0 at the low level ((d) in FIG. 8). The sense amplifier enable signal SAE0 is activated to the high level in synchronization with the failing edge of the clock signal PCK and is deactivated to the low level in synchronization with the falling edge of the equalizer signal EQD0. The block selection signal ELK, the equalizer signal EQD0, and the sense amplifier enable signal SAE0 are supplied to the memory block which is accessed in accordance with the row address signal RA.

In FIGS. 8 and 9, sense amplifier enable signals SAE0, SAE-N0, SAE-N1, ..., and SAE-F1 may be generated and write enable signals WE0, WE-N0, WE-N1, ..., and WE-F1 may not be generated. The sense amplifier enable signals SAE-N0, SAE-N1, ..., and SAE-F1 are sequentially delayed in the same manner as the equalizer signals EQD-N0, EQD-N1, and EQD-F1.

For example, when reading from the memory cell MC disposed in the vicinity of the node N0, complementary data held in the memory cell MC may be read to the bit lines BL-N0 and BLX-N0 in response to the word line signal WL-N0 activated to the high level ((e) in FIG. 8). A solid line illustrated at the bit lines BL-N0 and BLX-N0 represents the bit line BL-N0 and a broken line represents the bit line BLX-N0.

In response to the column selection signal COL-N0 activated to the high level, the bit line BL-N0 and the read data line RD-N0 are coupled to each other and a bit line BLX-N0 and a read data line RDX-N0 are coupled to each other. The voltage of the read data line RD-N0 decreases in conjunction with the voltage of the bit line BL-N0 ((f) in FIG. 8). The sense amplifier SA starts an amplification operation in response to the sense amplifier enable signal SAE-N0 activated to the high level. The activation timing of the sense amplifier enable signal SAE-N0 may be substantially the same as the deactivation timing of the word line signal WL-N0 ((g) in FIG. 8). After the read data is read from the memory cell MC to the bit lines BL-N0 and BLX-N0, the sense amplifier SA starts operation. The voltages of the pair of data lines RD-N0 and RDX-N0 are amplified ((h) in FIG. 8). The amplified read data is output to the data terminal DQ via the read amplifier RA and the data input/output circuit 16.

The waveforms of the word line signals WL-N0, WL-N1, ..., and WL-F1 and the dummy word line signals DWLP-N0, DWLP-N1, ..., and DWLP-F1 may be substantially the same as or similar to those of the corresponding signals illustrated in FIGS. 6 and 7. The waveforms of the column selection signals COL-N0, COL-N1, ..., and COL-F1 may be substantially the same as or similar to those of the corresponding signals illustrated in FIGS. 6 and 7. The amount of times T1 and T2 may be substantially the same as the amount of times T1 and T2 illustrated in FIGS. 6 and 7. A read operation time RT may be substantially the same as the write operation time WT illustrated in FIGS. 6 and 7. The read operation time RT of the memory cell MC disposed in the vicinity of the node N0 may be a period of time from the rising edge of the word line signal WL-N0 to the falling edge of the column selection signal COL-N0 ((i) in FIG. 8). The read operation time RT of the memory cell MC disposed in the vicinity of the node N0 may be a period of time from the rising edge of the word line signal WL-N0 to the rising edge of the sense amplifier enable signal SAE-N0. In the read operation, for example, the column selection signal COL-M0 and the equalizer signal EQD-M0 may not be output earlier. The activation timing of the column selection signal COL-M0 and the deactivation timing of the equalizer signal EQD-M0 are delayed so as to correspond to the activation timing of the word line signal WL-M0. For example, in FIG. 8, the activation timings of the column selection signals COL-M0, COL-M1, COL-F0, and COL-F1 may be advanced by an amount of time 12 relative to the activation timings of the word line signals WL-M0, WL-M1, WL-F0, and WL-F1, respectively, regardless of the positions of the signal lines through which the signals are transmitted. The deactivation timings of the equalizer signals EQD-M0, EQD-M1, EQD-F0, and EQD-F1 are advanced by an amount of time T2 relative to the activation timings of the word line signals WL-M0, WL-M1, WL-F0, and WL-F1, respectively, regardless of the positions of the transmission signal lines.

The activation timings of the sense amplifier enable signals SAE-M1, SAE-F0, and SAE-F1 are set to the deactivation timings of the word line signals WL-M1, WL-F0, and WL-F1, respectively, regardless of the positions of the transmission signal lines. The read operation time RT of the memory cell MC disposed in the vicinity of the node N0 or N1 may be substantially the same as the read operation time of the memory cell MC disposed in the vicinity of the node M0, M1, F0, or F1. Consequently, a decline in the read-operation margin may be reduced.

The repeater circuits REP2 that operate in synchronization with the dummy word line signals DWLE and DWLS are disposed along the transmission paths of the equalizer signal EQD and the sense amplifier enable signal SAE. A period in which the equalizer signal EQD is at the high level may include a period in which the column selection signal COL is at the high level, and may be set longer than the period in which the column selection signal COL is at the high level. In such a case, the repeater circuits REP2 may be eliminated. The activation timing of the sense amplifier enable signal SAE is delayed from the deactivation timing of the word line signal WL, and thus the repeater circuits REP2 may be eliminated. In the read operation, since the repeater circuits REP2 adjust the timing of the column selection signal COL, the read-operation margin improves. As a result of the timing adjustment of the column selection signal COL, the activation timing of the sense amplifier enable signal SAE may not be delayed.

Figure 10:
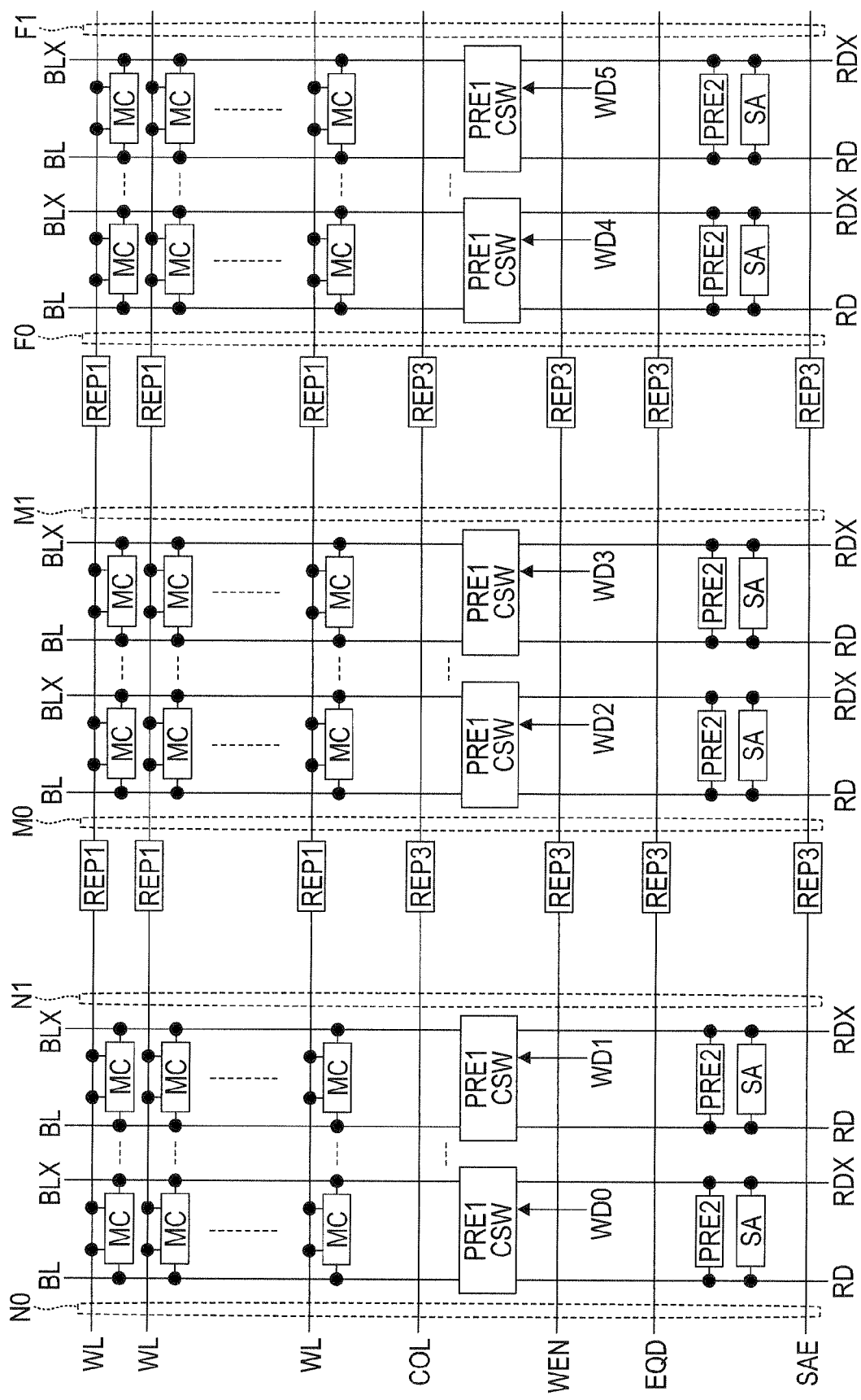
FIG. 10 illustrates a memory core in accordance with an exemplary aspect.

FIG. 10 illustrates a memory core in accordance with an exemplary aspect. In FIG. 10, descriptions of elements that are substantially the same as or similar to the elements illustrated in FIG. 4 are omitted or reduced. The memory core illustrated in FIG. 10 may not include the dummy word lines DWLP, DWLE, and DWLS and the dummy memory cells DMC illustrated in FIG. 4. In FIG. 10, the column selection signal COL, the write enable signal WEN, the equalizer signal EQD, and the sense amplifier enable signal SAE are transmitted from the left side to the right side in the figure via repeater circuits REP3. Other configurations may be substantially the same as or similar to those illustrated in FIG. 4.

Figure 11:
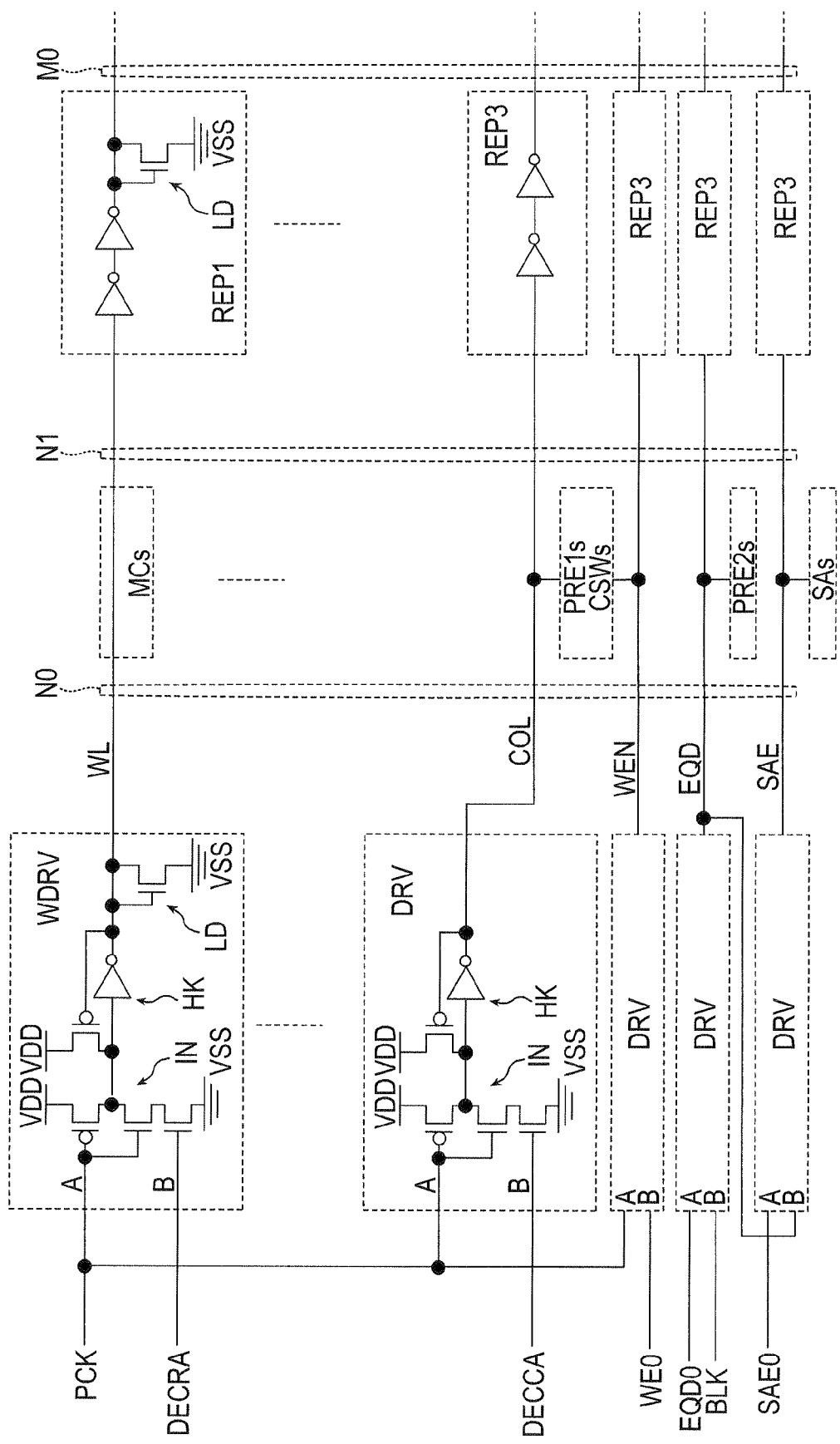
FIG. 11 illustrates a portion of a memory core in accordance with an exemplary aspect.

FIG. 11 illustrates a portion of a memory core. The memory core illustrated in FIG. 11 may be the memory core illustrated in FIG. 10. Repeater circuits REP3 may be disposed instead of the repeater circuits REP2 illustrated in FIG. 5. Each repeater circuit REP3 includes two CMOS inverters. The memory core illustrated in FIG. 11 may not include the dummy word lines DWLP, DWLE, and DWLS, and the dummy memory cells DMC. Other configurations may be substantially the same as or similar to those illustrated in FIG. 4.

Figure 12:
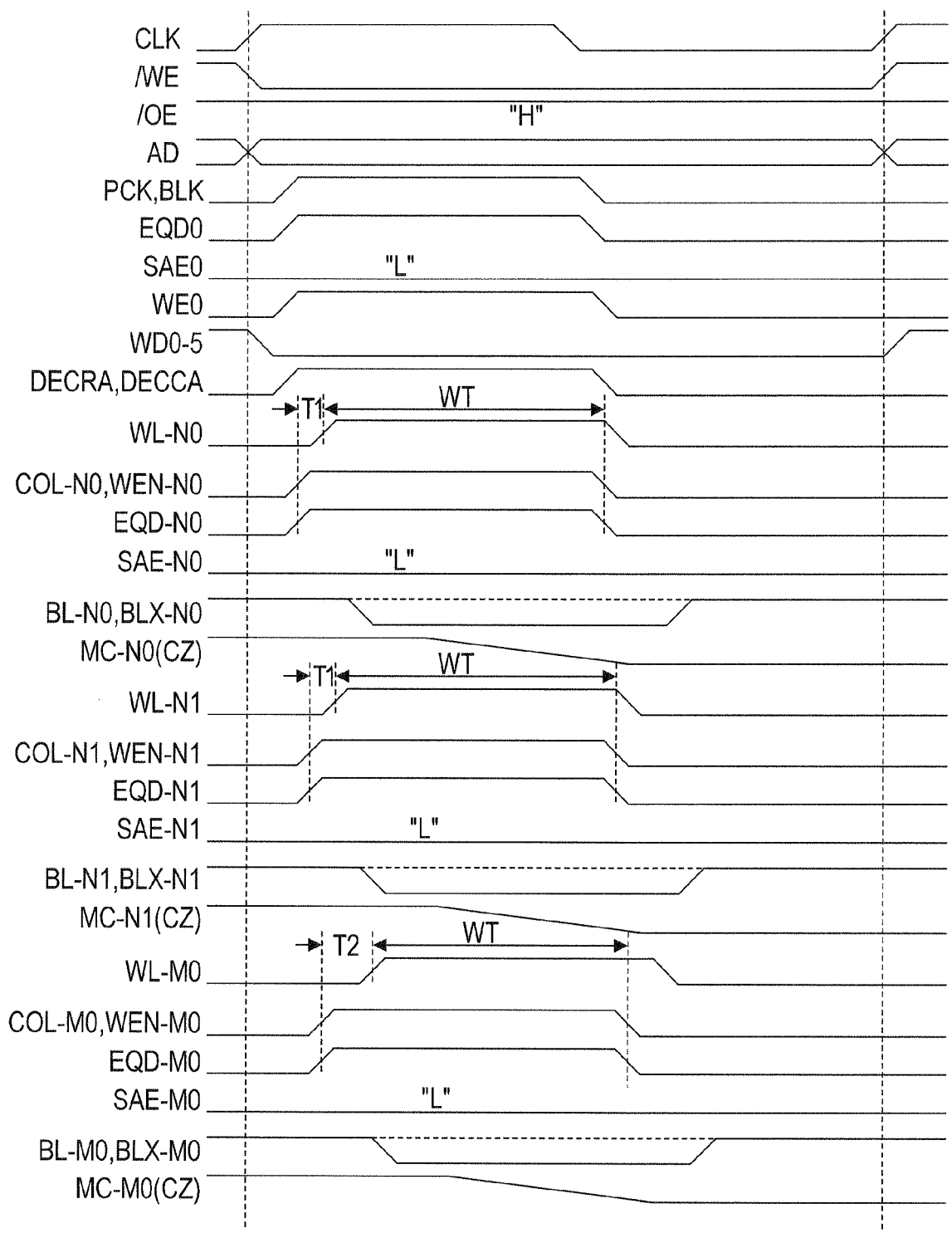
FIG. 12 illustrates a write operation of a semiconductor memory in accordance with an exemplary aspect.
Figure 13:
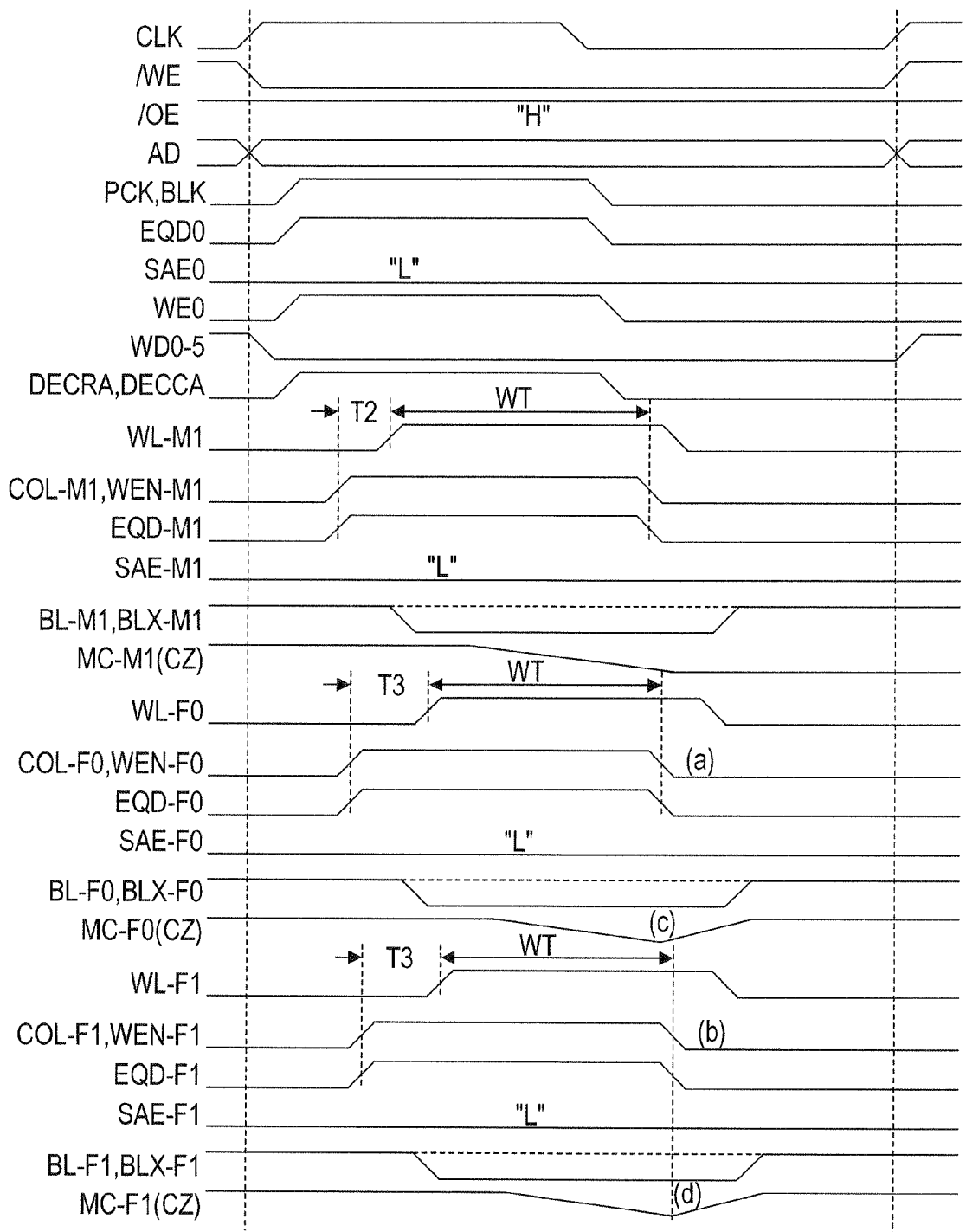
FIG. 13 illustrates a write operation of a semiconductor memory in accordance with an exemplary aspect.

FIGS. 12 and 13 illustrate a write operation of a semiconductor memory in accordance with an exemplary aspect. The semiconductor memory MEM illustrated in FIGS. 10 and 11 may perform the write operation illustrated in FIGS. 12 and 13. FIG. 12 illustrates an operation, for example, from the node N0 to the node M0 illustrated in FIG. 10. FIG. 13 illustrates an operation, for example, from the node M1 to the node F1 illustrated in FIG. 10. The waveforms of the clock signal CLK to the row decode signal DECRA and the column decode signal DECCA illustrated in FIG. 13 may be substantially the same as or similar to those illustrated in FIG. 12. In FIGS. 12 and 13, descriptions of operations that are substantially the same as or similar to the operations in FIGS. 6 and 7 are omitted or reduced.

The amount of time T1, T2, or T3 from the activation of the column selection signal COL-N0, COL-N1, COL-M0, COL-M1, COL-F0, or COL-F1 to the activation of the word line signal WL-N0, WL-N1, WL-M0, WL-M1, WL-F0, or WL-F1 may become long as the signal is transmitted. The write operation time WT of the memory cell MC becomes short as the memory cell MC is located farther from the word line driver WLDRV. For example, when writing to the memory cells MC-F0 and MC-F1 illustrated in FIG. 13, the column selection signals COL-F0 and COL-F1 may be deactivated to the low levels before data "0" is written to the storage node CZ ((a) and (b) in FIG. 13). In this case, a write failure that data is not written to the memory cells MC-F0 and MC-F1 may occur ((c) and (d) in FIG. 13). The write operation margin is low. For example, when data of logical "1" is written, a write failure may also occur. In order to improve the write operation margin, the period of the clock signal CLK may be increased so that the write cycle time is increased. The performance of the semiconductor memory MEM and a system including the semiconductor memory MEM may decline.

In FIGS. 12 and 13, data may not be written to the memory cells MC-F0 and MC-F1. A write operation failure may occur in the memory cell MC-M0 illustrated in FIG. 12, the memory cell MC-M0 having a relatively large amount of time T2 from the activation of the column selection signal COL-M0 to the activation of the word line signal WL-M0. In FIG. 6, since the repeater circuits REP2 are provided, an increase in the amount of time T2 relative to the amount of time T1 may be small. In FIG. 6, write failure may be reduced in the memory cell MC-M0. When at least one repeater circuit REP2 is disposed in the memory cell array ARY, the write operation margin improves.

Figure 14:
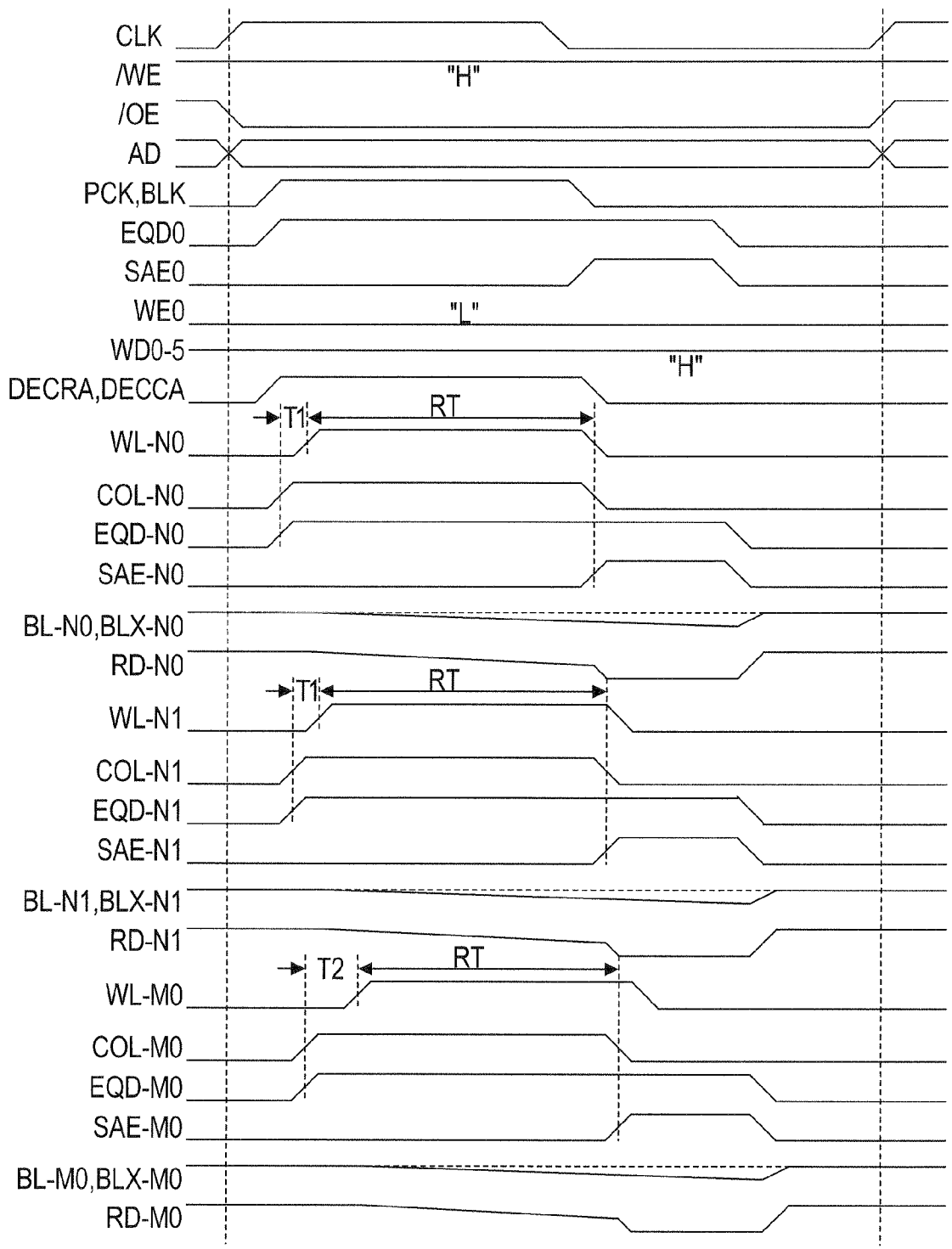
FIG. 14 illustrates a read operation of a semiconductor memory in accordance with an exemplary aspect.
Figure 15:
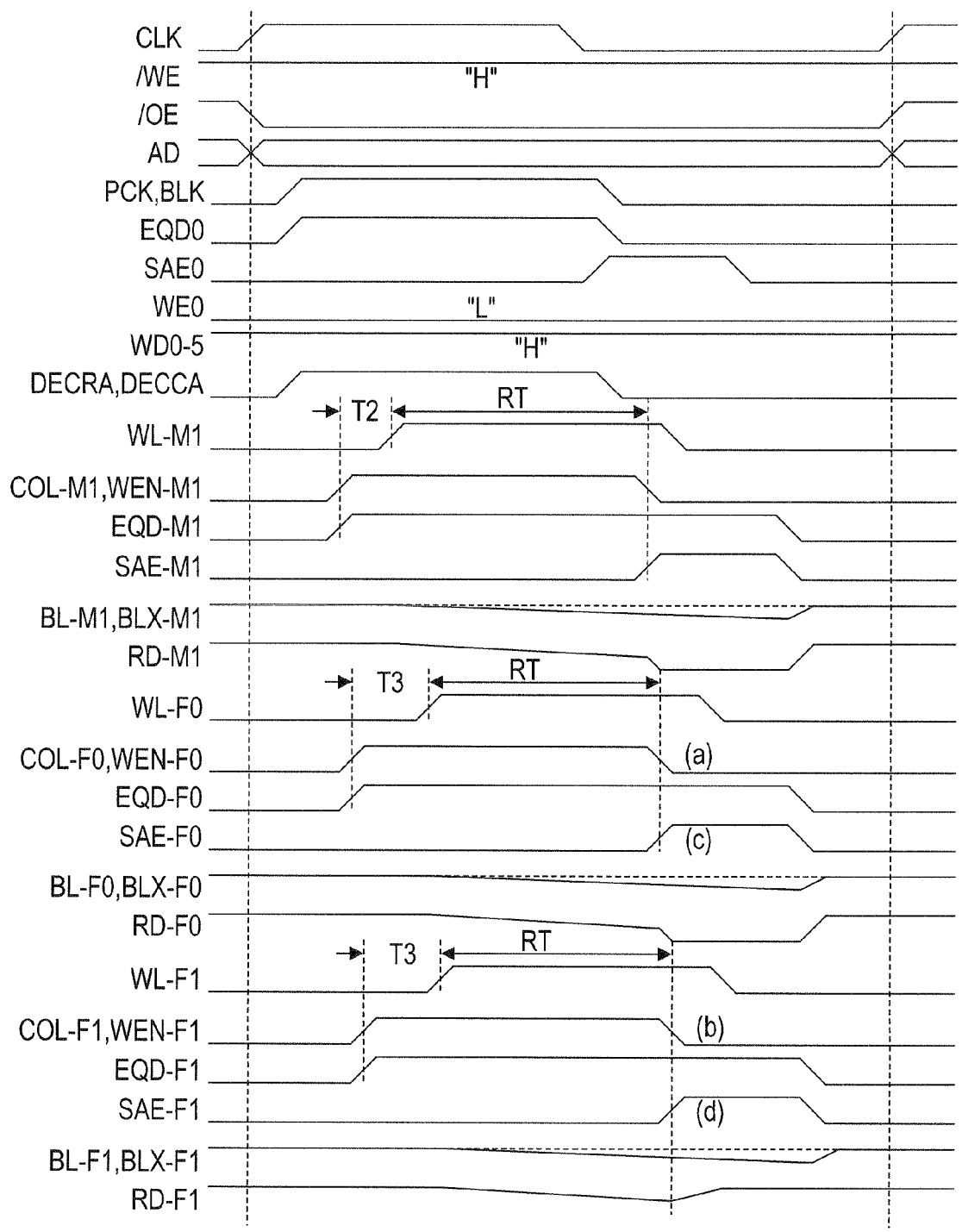
FIG. 15 illustrates a read operation of a semiconductor memory in accordance with an exemplary aspect.

FIGS. 14 and 15 illustrate a read operation of a semiconductor memory in accordance with an exemplary aspect. The semiconductor memory MEM illustrated in FIGS. 10 and 11 may perform the read operation illustrated in FIGS. 14 and 15. FIG. 14 illustrates an operation, for example, from the node N0 to the node M0 illustrated in FIG. 10. FIG. 15 illustrates an operation, for example, from the node M1 to the node F1 illustrated in FIG. 10. The waveforms of the clock signal CLK to the row decode signal DECRA and the column decode signal DECCA illustrated in FIG. 15 may be substantially the same as or similar to those illustrated in FIG. 14. In FIGS. 14 and 15, descriptions of operations that are substantially the same as or similar to the operations in FIGS. 8 and 9 are omitted or reduced.

In the read operation, the amount of time T1, T2, or T3 from the activation of the column selection signal COL-N0, COL-N1, COL-M0, COL-M1, COL-F0, or COL-F1 to the activation of the word line signal WL-N0, WL-N1, WL-M0, WL-M1, WL-F0, or WL-F1 becomes long, as in the write operation illustrated in FIGS. 12 and 13. The activation timing of the sense amplifier enable signal SAE-N0, SAE-N1, SAE-M0, SAE-M1, SAE-F0, or SAE-F1 is advanced relative to the activation timing of the word line signal WL-N0, WL-N1, WL-M0, WL-M1, WL-F0, or WL-F1. The read operation time RT of the memory cell MC becomes short as the memory cell MC is located farther from the word line driver WLDRV. For example, in the read operation of the memory cells MC-F0 and MC-F1 in FIG. 15, the column selection signals COL-F0 and COL-F1 may be deactivated before the voltage difference between the bit line BL-F1 and the bit line BLX-F1 increases ((a) and (b) in FIG. 15). Thus, the read data lines RD and RDX are decoupled from the pair of bit lines BL-F1 and BLX-F1. The sense amplifier enable signals SAE-F0 and SAE-F1 are activated to the high levels before the voltage difference between the bit line BL-F1 and the bit line BLX-F1 increases ((c) and (d) in FIG. 15). Thus, for example, when erroneous data is amplified by the sense amplifier SA, a read failure may occur. The read operation margin is low. In FIGS. 12 and 13, logical "0" data held in the memory cells MC are read. When the logical "1" held in the memory cells MC is read, a read failure may occur. In order to improve the read operation margin, the period of the clock signal CLK may be increased to delay the deactivation timing of the column selection signal COL-F0 and so on and the activation timing of the sense amplifier enable signal SAE-F0 and so on. The performance of the semiconductor memory and a system including the semiconductor memory may decline.

In the read operation illustrated in FIGS. 14 and 15, data may not be from the memory cells MC-F0 and MC-F1. A read write operation failure may occur in the memory cell MC-M0 illustrated in FIG. 14, the memory cell MC-M0 having a relatively large amount of time T2 from the activation of the column selection signal COL-M0 to the activation of the word line signal WL-M0. In FIG. 8, since the repeater circuits REP2 are provided, an increase in the amount of time T2 relative to the amount of time T1 is small and the read operation time RT may be reduced slightly. Consequently, in FIG. 8, read failure may not occur in the memory cell MC-M. When at least one repeater circuit REP2 is disposed in the memory cell array ARY, the read operation margin may improve.

For each repeater circuit REP2, the generation timings of the column selection signal COL, the write enable signal WEN, the equalizer signal EQD, and the sense amplifier enable signal SAE are adjusted in accordance with the generation timing of the word line signal WL. Thus, when a large number of memory cells MC are coupled to the word line WL and the length of the word line WL is large, the write operation margin and the read operation margin of the semiconductor memory MEM improve. The yield and performance of the semiconductor memory MEM may improve.

Figure 16:
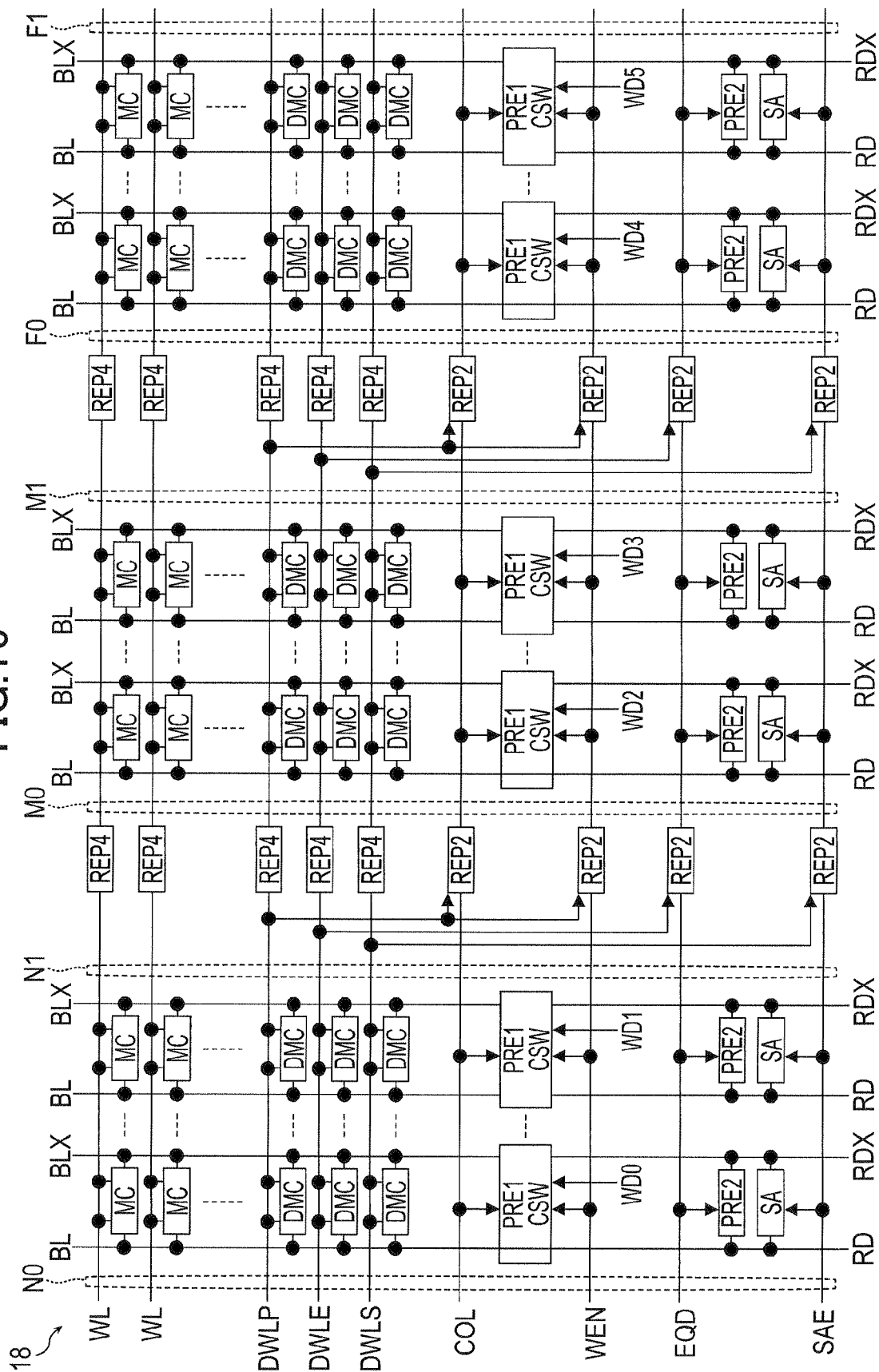
FIG. 16 illustrates a memory core in accordance with an exemplary aspect.

FIG. 16 illustrates a memory core in accordance with an exemplary aspect. In FIG. 16, elements that are substantially the same as the elements illustrated in FIG. 4 are denoted by the same reference numerals, and descriptions thereof are omitted or reduced. Repeater circuits REP4 may be disposed instead of the repeater circuits REP1 illustrated in FIG. 4. Other configurations may be substantially the same as or similar to those illustrated in FIGS. 1 to 4. The semiconductor memory MEM may be an SRAM. The semiconductor memory MEM may operate in synchronization with the clock signal. The semiconductor memory MEM may operate asynchronously with the clock signal. The semiconductor memory MEM may include a memory macro (IP) to be provided in a system LSI or the like and may include a semiconductor storage device enclosed in a package.

Figure 17:
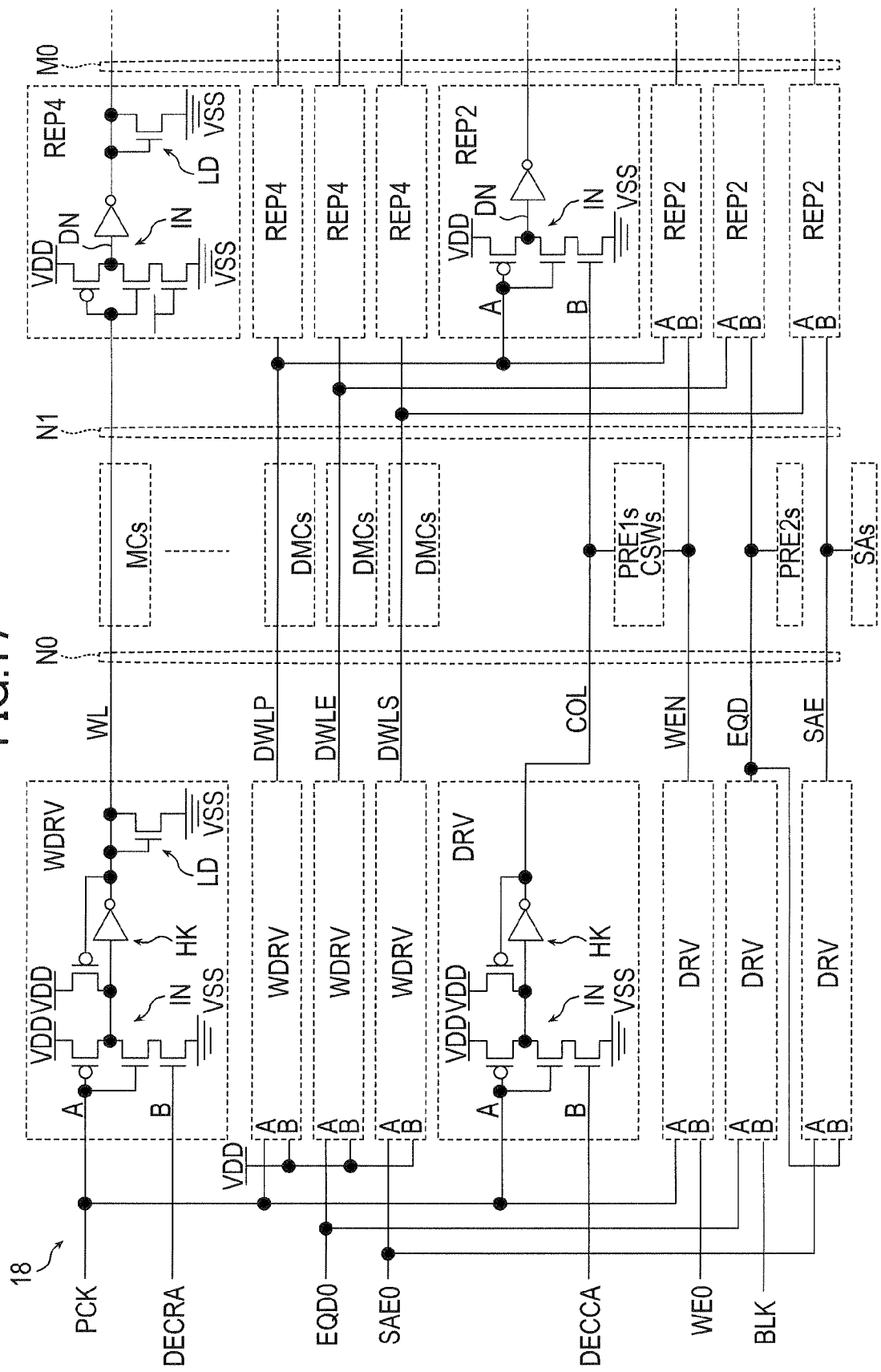
FIG. 17 illustrates a portion of a memory core in accordance with an exemplary aspect.

FIG. 17 illustrates a portion of a memory core in accordance with an exemplary aspect. A memory core 18 illustrated in FIG. 17 may be the memory core illustrated in FIG. 16. Repeater circuits REP4 may be disposed instead of the repeater circuits REP1 illustrated in FIG. 5. The repeater circuit REP4 may include a configuration in which a load circuit LD is added to the repeater circuit REP2. In input circuit IN, the gate of an nMOS transistor is coupled to a power supply line VDD. Gates of the other nMOS and pMOS transistors are coupled to the word line WL.

Since the repeater circuit REP2 is substantially the same as or similar to the repeater circuit REP4, the difference between the timings of the word line signal WL and the column selection signal COL is reduced.

The memories illustrated in FIGS. 16 and 17 have an advantage that is substantially the same as or similar to that of the above-described memories. Since the difference between the timings of the word line signal WL and the column selection signal COL is reduced, the write operation time WT illustrated in FIGS. 6 and 7 increases and the write operation margin improves. The read operation time RT illustrated in FIGS. 8 and 9 increases and the read operation margin improves.

Figure 18:
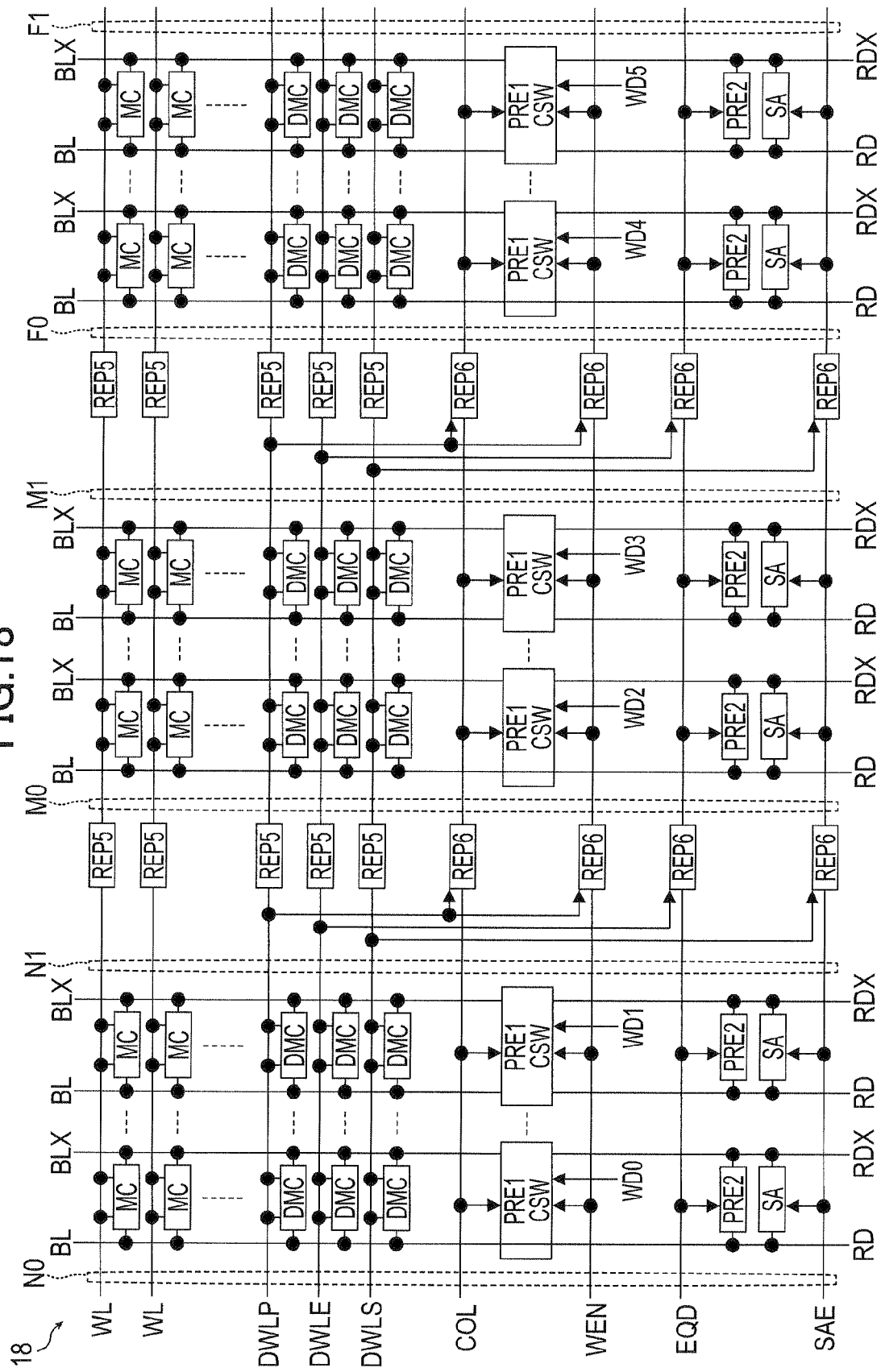
FIG. 18 illustrates a memory core in accordance with an exemplary aspect.

FIG. 18 illustrates memory core in accordance with an exemplary aspect. In FIG. 18, elements that are substantially the same as or similar to the elements illustrated in FIG. 4 are denoted by the same reference numerals, and descriptions thereof are omitted or reduced. Repeater circuits REP5 and REP6 may be disposed instead of the repeater circuits REP1 and REP2 illustrated in FIG. 4. Other configurations may be substantially the same as or similar to those illustrated in FIGS. 1 to 4. The semiconductor memory MEM may be an SRAM. The semiconductor memory MEM may operate in synchronization with the clock signal. The semiconductor memory MEM may operate asynchronously with the clock signal. The semiconductor memory MEM may include a memory macro (IP) to be provided in a system LSI or the like and may include a semiconductor storage device enclosed in a package.

Figure 19:
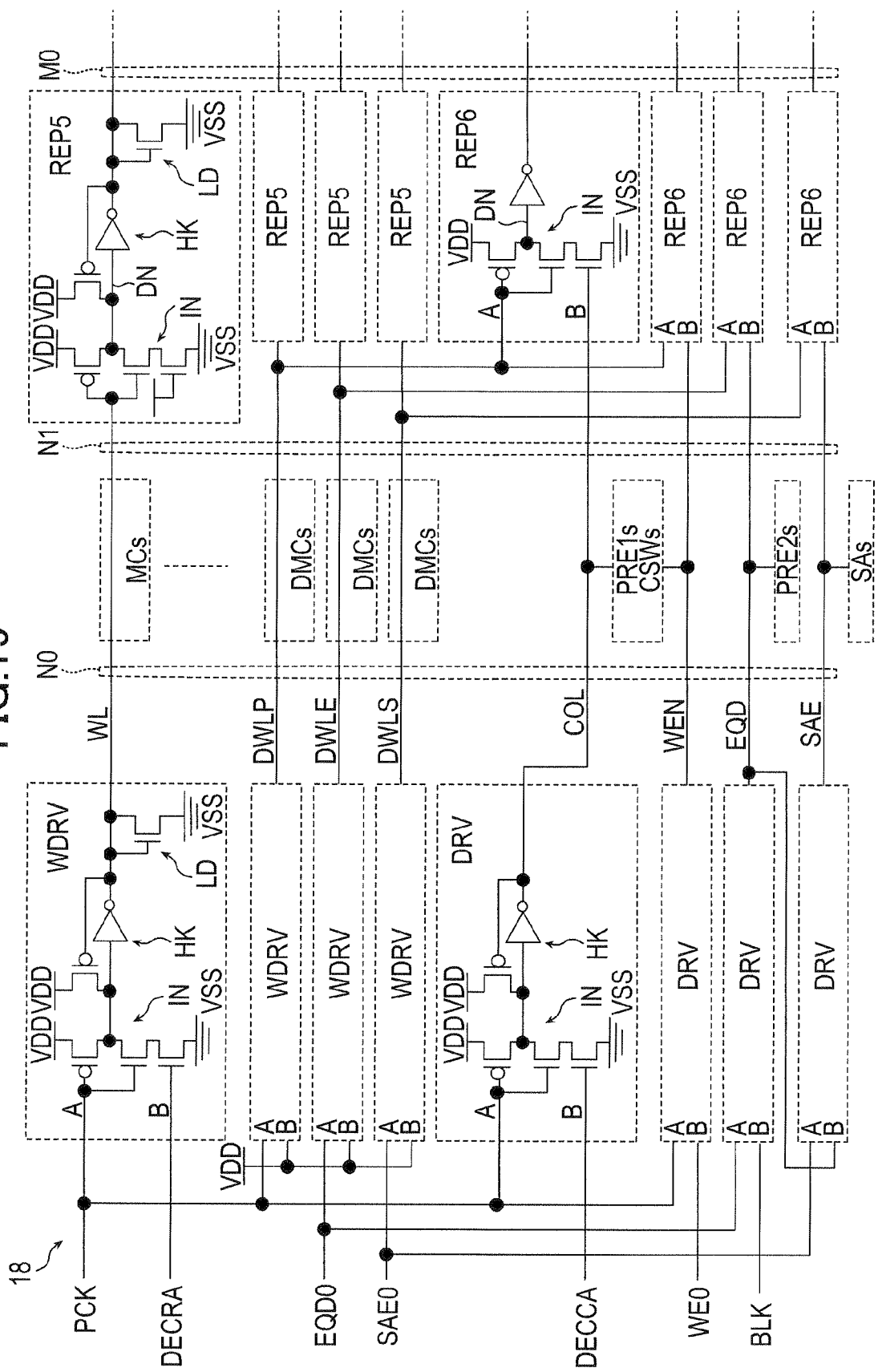
FIG. 19 illustrates a portion of a memory core in accordance with an exemplary aspect.

FIG. 19 illustrates a portion of a memory core in accordance with an exemplary aspect. The memory core illustrated in FIG. 19 may be the memory core 18 illustrated in FIG. 18. Repeater circuits REP5 and REP6 may be disposed instead of the repeater circuits REP1 and REP2 illustrated in FIG. 5. The repeater circuit REP5 may be a circuit that is substantially the same as or similar to the word line driver WLDRV. The repeater circuit REP5 includes a half keeper circuit HK. In an input circuit IN in the repeater circuit REP5, a gate of an nMOS transistor is coupled to a power supply line VDD. The gates of the other nMOS and pMOS transistors are coupled to the word line WL.

The repeater circuit REP6 may be a repeater circuit REP5 that does not include a load circuit LD. The repeater circuit REP6 may include a half keeper circuit HK instead of the inverter in the repeater circuit REP2 illustrated in FIG. 5.

In the write operation and the read operation, for example, one of 16 column selection signals COL may be activated to the high level in response to the column address signal CA and the other column selection signals COL may be maintained to the low level, for example, to the deactivated state. In the repeater circuit REP6 that receives the column selection signal COL held at the low level, which is an output of the input circuit IN, a dynamic node DN becomes a high-level floating state when the dummy word line signal DWLP is activated to the high level. The half keeper circuit HK maintains the dynamic node DN at the high level.

The repeater circuit REP6 may be a repeater circuit REP5 that does not include a load circuit LD illustrated in FIG. 17. The difference between the timings of the word line signal WL and the column selection signal COL may be reduced. The write operation margin and the read operation margin improve.

The semiconductor memory illustrated in FIG. 18 has substantially the same advantage as that of the previous embodiment. When the amount of clock cycle time is large and the period of time in which the dummy word line signal DWLP is activated to the high level is long, the dynamic node DN is maintained at the high level. Malfunction of the semiconductor memory MEM may be reduced and the write operation margin and the read operation margin may not decline.

Figure 20:
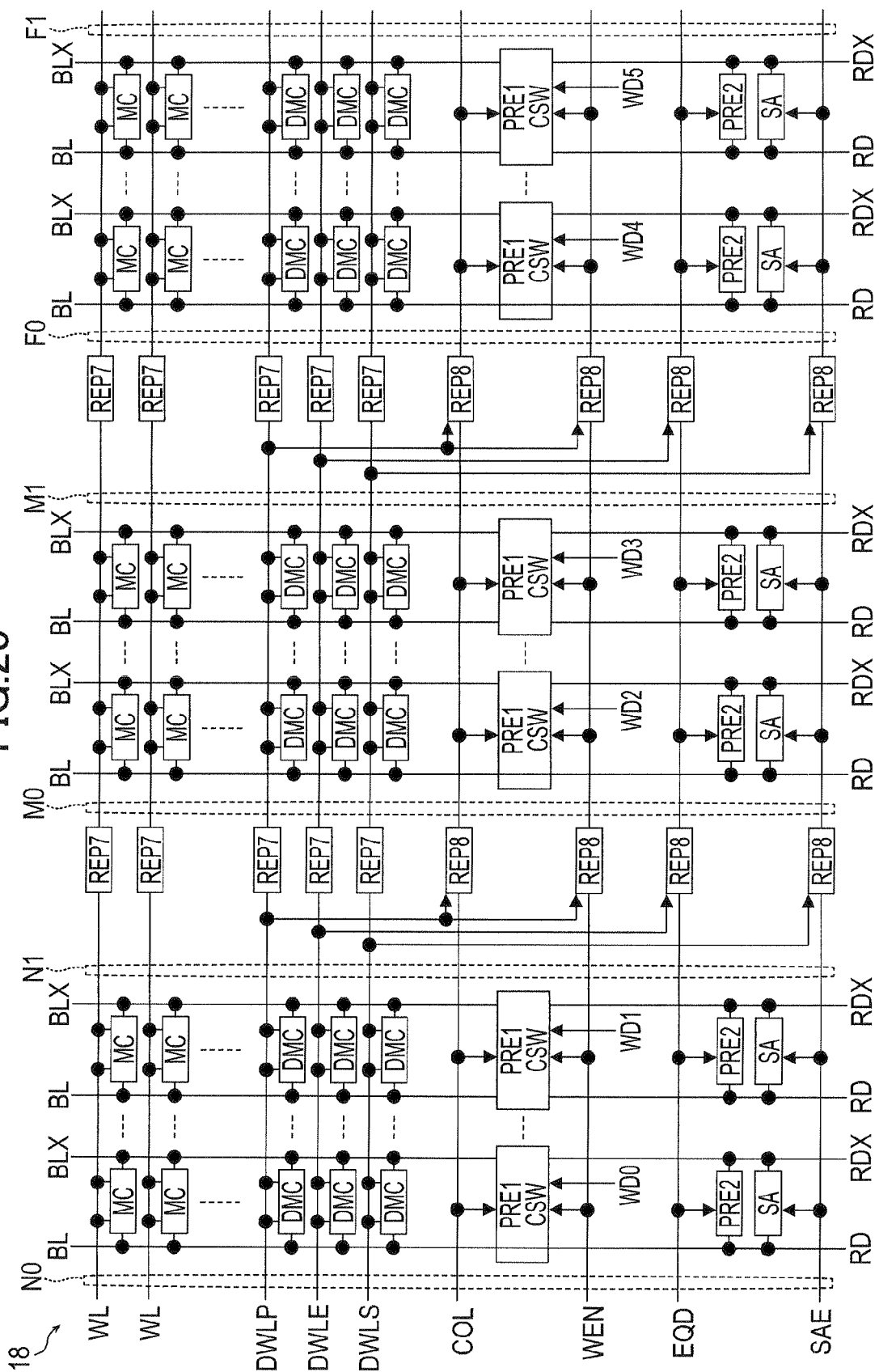
FIG. 20 illustrates a memory core in accordance with an exemplary aspect.

FIG. 20 illustrates a memory core in accordance with an exemplary aspect. A semiconductor memory MEM illustrated in FIG. 20 may be the semiconductor memory illustrated in FIG. 18. In FIG. 20, elements that are substantially the same as or similar to the elements illustrated in FIG. 4 are denoted by the same reference numerals, and descriptions thereof are omitted or reduced. Repeater circuits REP7 and REP8 may be disposed instead of the repeater circuits REP1 and REP2 illustrated in FIG. 4. Other configurations may be substantially the same as or similar to those illustrated in FIGS. 1 to 4. The semiconductor memory MEM may be an SRAM. The semiconductor memory MEM may operate in synchronization with the clock signal. The semiconductor memory MEM may operate asynchronously with the clock signal. The semiconductor memory MEM may include a memory macro (IP) to be provided in a system LSI or the like and may include a semiconductor storage device enclosed in a package.

Figure 21:
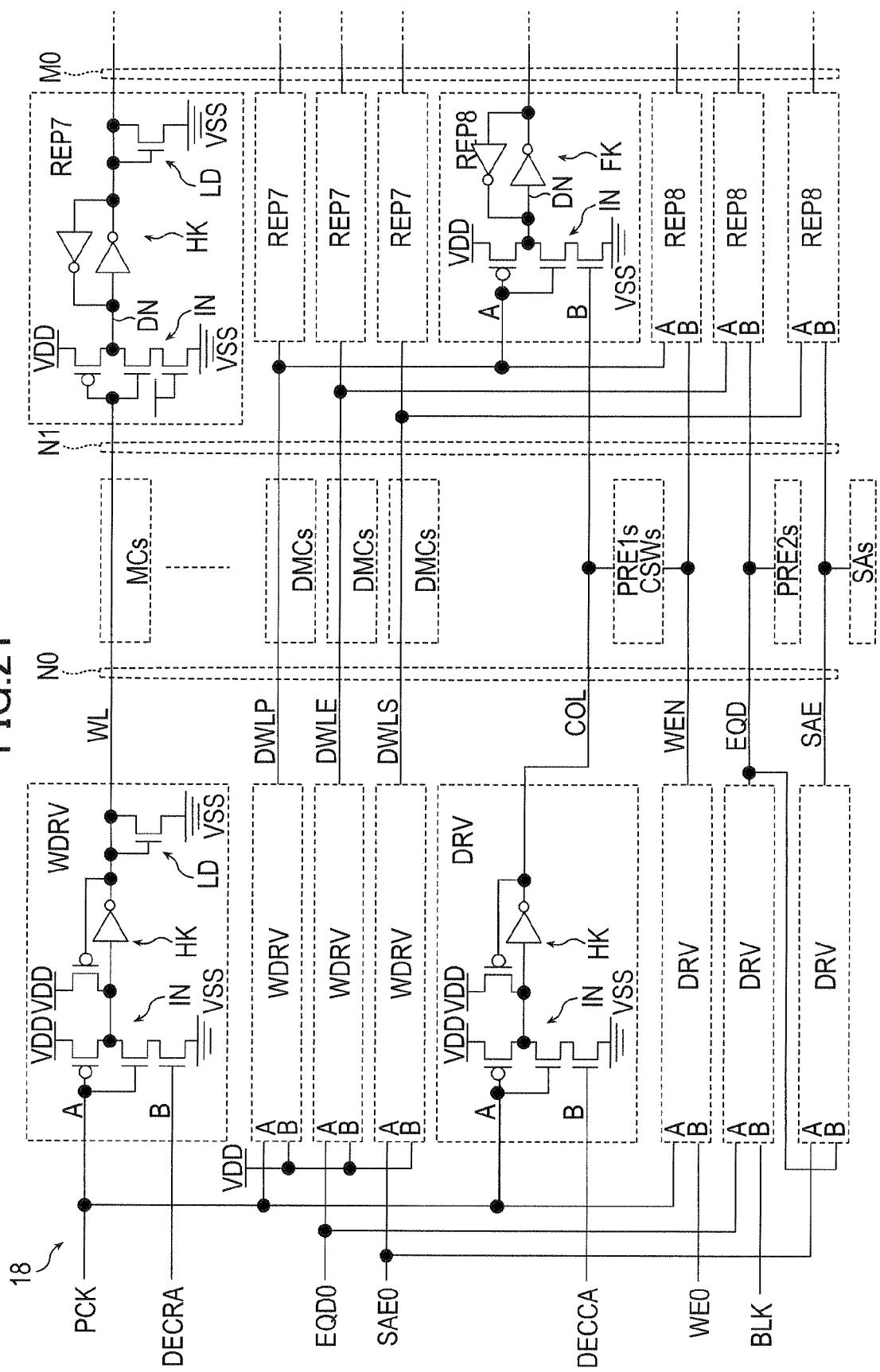
FIG. 21 illustrates a portion of a memory core in accordance with an exemplary aspect.

FIG. 21 illustrates a memory core in accordance with an exemplary aspect. A semiconductor memory illustrated in FIG. 21 may be the semiconductor memory illustrated in FIG. 20. Repeater circuits REP7 and REP8 may be disposed instead of the repeater circuits REP1 and REP2 illustrated in FIG. 5. The repeater circuits REP7 and REP8 may include full keeper circuits FK instead of the half keeper circuits HK in the repeater circuits REP5 and REP6 illustrated in FIG. 19. The full keeper circuit FK may include a pair of CMOS inverters. An input and an output of one of the CMOS inverters are coupled with an output and an input of the other CMOS inverter, respectively.

In the write operation and the read operation, the column selection signal COL is deactivated to the low level before the dummy word line signal DWLP is deactivated to the low level. A dynamic node DN, which is an output of the input circuit IN, is put into a low-level floating state. However, the full keeper circuit FK maintains the dynamic node DN at the low level. Even when the dynamic node DN that is the output of the input circuit IN is in the high-level floating state, the full keeper circuit FK maintains the dynamic node DN at the high level, in the same manner as the half keeper circuit HK.

When the write enable signal WEN is deactivated to the low level before the dummy word line signal DWLP is deactivated to the low level, the dynamic node DN is maintained at the low level. When the equalizer signal EQD is deactivated to the low level before the dummy word line signal DWLE is deactivated to the low level, the dynamic node DN is maintained at the low level. When the sense amplifier enable signal SAE is deactivated to the low level before the dummy word line signal DWLS is deactivated to the low level, the dynamic node DN is maintained at the low level.

The repeater circuit REP8 may be a repeater circuit REP7 that does not include a load circuit LD, as illustrated in FIG. 17. The difference between the timings of the word line signal WL and the column selection signal COL is reduced and the write operation margin and the read operation margin improve.

The semiconductor memory illustrated in FIG. 20 has substantially the same advantage as that of the previous embodiment. For example, when the amount of time from the deactivation of the dummy word line signal DWLP to the deactivation of the column selection signal COL is large, the dynamic node DN may be maintained at the low level. Consequently, malfunction of the semiconductor memory MEM may be reduced and the write operation margin and the read operation margin may not decline.

Figure 22:
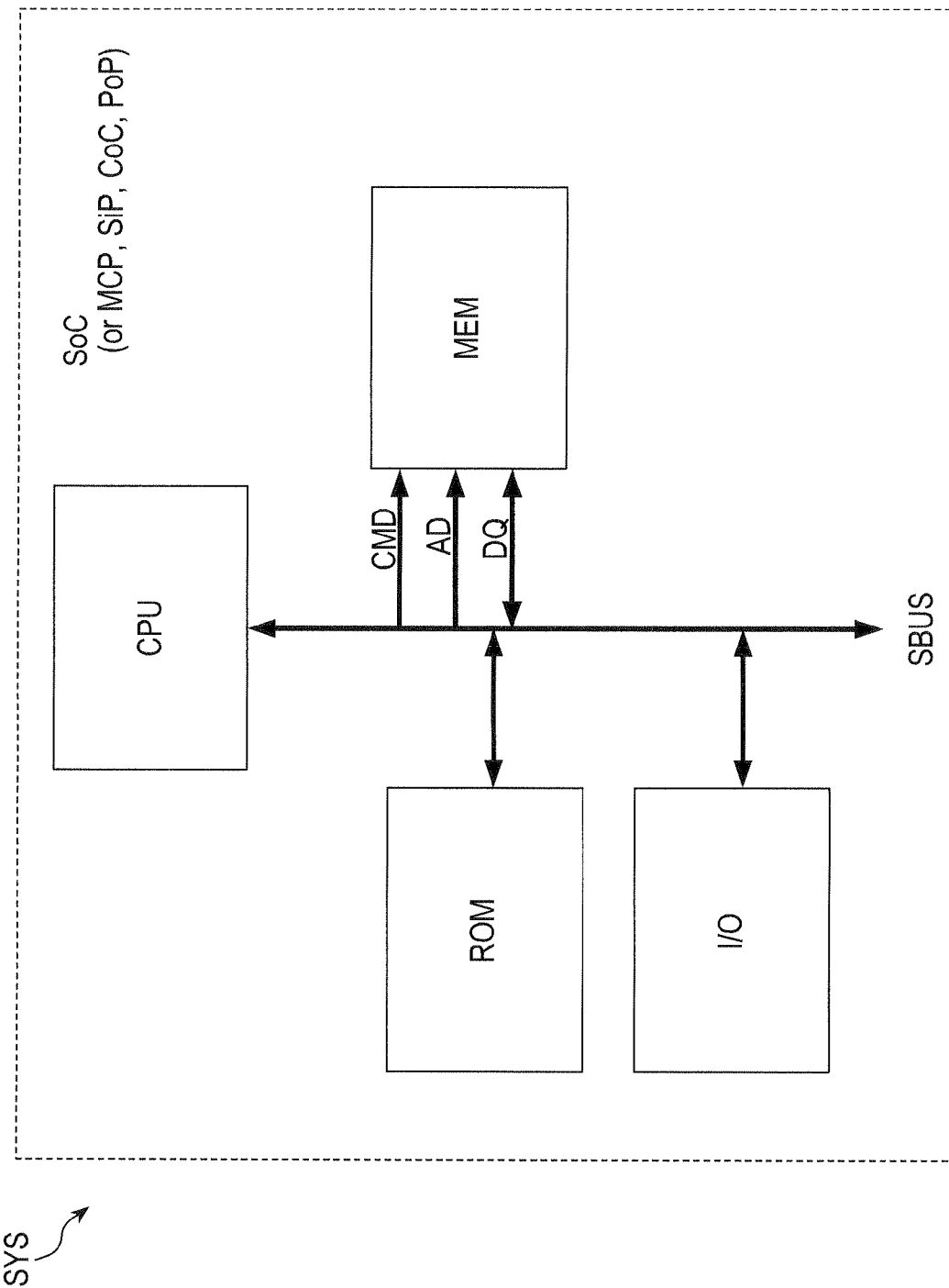
FIG. 22 illustrates a system in accordance with an exemplary aspect.

FIG. 22 illustrates a system in accordance with an exemplary aspect. The above-described semiconductor memory MEM may be provided in a system SYS illustrated in FIG. 22. The system SYS, for example a user system, may include, for example, at least part of a microcomputer system for portable equipment or the like. The system SYS may include a system-on-chip SoC in which multiple macros are integrated on a silicon substrate. The system SYS may include a multi-chip package MCP in which a plurality of chips are stacked on a package substrate. The system SYS may include a system-in-package (Sip) in which plurality of chips are provided on a package substrate such as a lead frame. The system SYS may include a chip-on-chip (CoC) or a package-on-package (PoP).

For example, the SoC may include a CPU (central processing unit), for example a controller, a ROM (random access memory), a peripheral circuit I/O, and the above-described semiconductor memory MEM. The CPU, the ROM, the peripheral circuit I/O, and the semiconductor memory MEM may be coupled to each other through a system bus SBUS. A memory controller may be provided between the CPU and the semiconductor memory MEM.

The CPU accesses the ROM, the peripheral circuit I/O, and the semiconductor memory MEM to control the entire system. The semiconductor memory MEM performs reading and writing in response to an access request from the CPU. The system SYS includes the CPU and the semiconductor memory MEM.

The previous embodiment may be applied to an SRAM, a DRAM, a ferroelectric memory, a flash memory, and so on.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor memory comprising:
a word line coupled to memory cells and configured to transmit a word line signal;
at least one word repeater circuit including a first load circuit that is disposed on the word line;
a first dummy word line disposed along the word line and configured to transmit a first dummy word line signal;
at least one dummy repeater circuit including a second load circuit that is disposed on the first dummy word line;
bit lines coupled to the memory cells;
column switches configured to couple the bit lines to data lines, respectively;
a column selection line disposed along the word line and configured to transmit a column selection signal for controlling each column switch; and
at least one column repeater circuit disposed on the column selection line and configured to output the column selection signal in synchronization with the first dummy word line signal input to the first dummy repeater circuit.

2. The semiconductor memory according to claim 1, wherein the first load circuit reduces a voltage of the word line.

3. The semiconductor memory according to claim 1, wherein the second load circuit has a configuration that is substantially the same as a configuration of the first load circuit.

4. The semiconductor memory according to claim 1, wherein the first dummy repeater circuit and the column repeater circuit are disposed at substantially the same pitch as the word repeater circuit, and
wherein the column repeater circuit is further configured to output the received column selection signal in synchronization with the first dummy word line signal input to the corresponding first dummy repeater circuit.

5. The semiconductor memory according to claim 1, wherein each column switch includes a read switch that is turned on when the column selection signal is active.

6. The semiconductor memory according to claim 5, further comprising:
a write enable signal line disposed along the word line and configured to transmit a write enable signal; and
at least one write repeater circuit disposed on the write enable signal line and configured to output the write enable signal in synchronization with the first dummy word line signal input to the first dummy repeater circuit,
wherein each column switch includes a write switch that is configured to turn on when the column selection signal and the write enable signal are active.

7. The semiconductor memory according to claim 1, wherein the word repeater circuit and the first dummy repeater circuit include a circuit having substantially the same configuration as the column repeater circuit and a third load circuit having substantially the same configuration as the first load circuit.

8. The semiconductor memory according to claim 7, wherein the column repeater circuit includes:
an input circuit configured to put an output into a floating state in response to the activated first dummy word line signal and the deactivated column selection signal; and
a half keeper circuit configured to hold the output at a certain level when the output changes to the floating state.

9. The semiconductor memory according to claim 7, wherein the column repeater circuit includes:
an input circuit configured to put an output into a floating state in response to the activated first dummy word line signal and the deactivated column selection signal; and
a full keeper circuit configured to maintain the output at a certain level when the output changes to the floating state.

10. The semiconductor memory according to claim 1, further comprising:
a second dummy word line disposed along the word line and configured to transmit a second dummy word line signal;
at least one second dummy repeater circuit including a third load circuit that is disposed on the second dummy word line;
sense amplifiers coupled to the data lines;
a sense amplifier enable signal line disposed along the word line and configured to transmit a sense amplifier enable signal for controlling each sense amplifier; and
at least one sense repeater circuit disposed on the sense amplifier enable signal line and configured to output the sense amplifier enable signal in synchronization with the second dummy word line signal input to the second dummy repeater circuit.

11. The semiconductor memory according to claim 10, wherein the second dummy repeater circuit and the sense repeater circuit are disposed at substantially the same pitch as the word repeater circuit, and
wherein the sense repeater circuit is further configured to output the sense amplifier enable signal in synchronization with the second dummy word line signal input to the corresponding second dummy repeater circuit.

12. The semiconductor memory according to claim 1, further comprising:
a third dummy word line disposed along the word line and configured to transmit a third dummy word line signal;

at least one third dummy repeater circuit including a fourth load circuit that is disposed on the third dummy word line;

data precharge circuits coupled to the data lines, respectively;

a precharge signal line disposed along the word line and configured to transmit a precharge signal for controlling each data precharge circuit; and at least one precharge repeater circuit disposed on the precharge signal line and configured to output the precharge signal in synchronization with the third dummy word line signal input to the third dummy repeater circuit.

13. The semiconductor memory according to claim 12, wherein the third dummy repeater circuit and the precharge repeater circuit are disposed at substantially the same pitch as the word repeater circuit, and wherein the precharge repeater circuit is further configured to output the precharge signal in synchronization with the third dummy word line signal input to the corresponding third dummy repeater circuit.

14. The semiconductor memory according to claim 1, further comprising bit precharge circuits coupled to the bit lines and configured to operate in response to column selection signals output from the column repeater circuits.

15. The semiconductor memory according to claim 1, wherein the load circuit includes a n-type metal oxide semiconductor transistor disposed between the word line and a ground line and having a gate coupled to the word line.

16. A system comprising:

a semiconductor memory; and a controller configured to access the semiconductor memory, wherein the semiconductor memory includes:

a word line coupled to memory cells and configured to transmit a word line signal;

at least one word repeater circuit including a first load circuit that is disposed on the word line;

a first dummy word line disposed along the word line and configured to transmit a first dummy word line signal;

at least one dummy repeater circuit including a second load circuit that is disposed on the first dummy word line;

bit lines coupled to the memory cells;

column switches configured to couple the bit lines to data lines, respectively;

a column selection line disposed along the word line and configured to transmit a column selection signal for controlling each column switch; and at least one column repeater circuit disposed on the column selection line and configured to output the column selection signal in synchronization with the first dummy word line signal input to the first dummy repeater circuit.

* * * * *